US009857457B2

(12) United States Patent
Chowdhury

(10) Patent No.: US 9,857,457 B2
(45) Date of Patent: Jan. 2, 2018

(54) ULTRASONIC SENSOR MICROARRAY AND ITS METHOD OF MANUFACTURE

(71) Applicant: UNIVERSITY OF WINDSOR, Windsor (CA)

(72) Inventor: Sazzadur Chowdhury, Windsor (CA)

(73) Assignee: UNIVERSITY OF WINDSOR, Windsor (CA)

( * ) Notice: Subject to any disclaimer, the term of this patent is extended or adjusted under 35 U.S.C. 154(b) by 289 days.

(21) Appl. No.: 14/768,634

(22) PCT Filed: Mar. 12, 2014

(86) PCT No.: PCT/CA2014/000217
§ 371 (c)(1),
(2) Date: Aug. 18, 2015

(87) PCT Pub. No.: WO2014/138889
PCT Pub. Date: Sep. 18, 2014

(65) Prior Publication Data
US 2016/0041259 A1   Feb. 11, 2016

Related U.S. Application Data

(63) Continuation-in-part of application No. 13/804,279, filed on Mar. 14, 2013, now Pat. No. 9,035,532.

(30) Foreign Application Priority Data

Nov. 1, 2013  (WO) ................ PCT/CA2013/000937

(51) Int. Cl.
*H02N 1/06* (2006.01)
*G01S 7/52* (2006.01)
(Continued)

(52) U.S. Cl.
CPC .............. *G01S 7/52* (2013.01); *B06B 1/0292* (2013.01); *B81C 1/00269* (2013.01)

(58) Field of Classification Search
CPC ...... H02N 1/006; H02N 2/006; B06B 1/0292; B06B 2201/20; B06B 2201/40; B06B 2201/70
(Continued)

(56) References Cited

U.S. PATENT DOCUMENTS 6,632,178 B1   10/2003   Fraser
6,942,750 B2   9/2005    Chou
(Continued)

FOREIGN PATENT DOCUMENTS

CA   PCT/CA2014/000217   3/2014
WO   WO2009/00157 A1     12/2008
WO   WO2012/075106 A1    6/2012

OTHER PUBLICATIONS

IPRP in respect of International Application No. PCT/CA2013/000937.
(Continued)

*Primary Examiner* — Thanh Lam

(57) ABSTRACT

A sensor assembly including one or more capacitive micromachined ultrasonic transducer (CMUT) microarray modules which are provided with a number of individual transducers. The microarray modules are arranged to simulate or orient individual transducers in a hyperbolic paraboloid geometry. The transducers/sensor are arranged in a rectangular or square matrix and are activatable individually, selectively or collectively to emit and received reflected beam signals at a frequency of between about 100 to 170 kHz.

27 Claims, 23 Drawing Sheets

(51) Int. Cl.
B81C 1/00 (2006.01)
B06B 1/02 (2006.01)

(58) Field of Classification Search
USPC .......... 310/300, 302–304, 308–309, 311; 438/51; 367/140, 181, 153–154; 29/594
See application file for complete search history.

(56) References Cited

U.S. PATENT DOCUMENTS

| | | | |
|---|---|---|---|
| 7,152,481 B2 | 12/2006 | Wang | |
| 7,545,012 B2 | 6/2009 | Smith et al. | |
| 7,545,075 B2 | 6/2009 | Huang et al. | |
| 7,612,483 B2 | 11/2009 | Degertekin | |
| 7,670,290 B2 | 3/2010 | Hossack et al. | |
| 7,781,238 B2 | 8/2010 | Wodnicki | |
| 7,830,069 B2 | 11/2010 | Lukacs et al. | |
| 7,839,722 B2 | 11/2010 | Wagner et al. | |
| 7,892,176 B2 | 2/2011 | Wodnicki et al. | |
| 7,923,795 B2 | 4/2011 | Kobayashi et al. | |
| 8,324,006 B1* | 12/2012 | Adler | B06B 1/0292 257/416 |
| 8,563,345 B2* | 10/2013 | Adler | B06B 1/0292 257/416 |
| 9,035,532 B2 | 5/2015 | Chowdhury | |
| 9,660,554 B2* | 5/2017 | Huang | B06B 1/0292 |
| 2008/0315331 A1 | 12/2008 | Wodnicki | |
| 2011/0025337 A1 | 2/2011 | Jenninger et al. | |
| 2011/0068654 A1 | 3/2011 | Cheng | |
| 2011/0084570 A1 | 4/2011 | Soeda et al. | |
| 2011/0163630 A1 | 7/2011 | Klootwijk et al. | |
| 2012/0025337 A1 | 2/2012 | Leclair | |
| 2013/0049527 A1* | 2/2013 | Hasegawa | H01G 5/16 310/300 |
| 2014/0084747 A1 | 3/2014 | Lovera-Prieto et al. | |
| 2014/0239768 A1* | 8/2014 | Johnson | B06B 1/0292 310/300 |

OTHER PUBLICATIONS

Design of a MEMS Discretized Hyperbolic Paraboloid Geomtry Ultrasonic Sensor Microarray, IEEE Transactions on Ultrasonic, ferroelectrics and Frequency Control, vol. 55, No. 6, Jun. 2008.

Capacitive micromachined ultrasonic transducer (CMUT) arrays for medical imaging, Caronti et al., Microelectronics Journal, vol. 37, pp. 770-777, Dec. 13, 2005.

Abbas Syed, "A Non-planar CMUT array for Automotive Blind Spot Dection ". University of Windsor, Electronic Theses and Dissertations. Chapters 3.1, 3.2, 4 and 5, 2009.

Meloche et al., "Design of a MEMS Discretized Hyperbolic Paraboloid Geometry Ultrasonic Sensor Microarray", IEEE Transactions on Ultrasonics, Ferroelectrics and Frequency Control. vol. 65, No. 6, Jun. 2008.

Zure et al., "Dynamic analysis of an SOI based CMUT", IEEE ICIT 2012, Department of Electrical and Computer Engineering, University of Windsor, the entire document.

* cited by examiner

ULTRASONIC SENSOR MICROARRAY AND ITS METHOD OF MANUFACTURE

RELATED APPLICATIONS

This application is a continuation-in-part of U.S. patent application Ser. No. 13/804,279, filed 14 Mar. 2013.

This application is related to commonly owned International Patent Application Serial No. PCT/CA2013/000937, filed 1 Nov. 2013, entitled "Ultrasonic Sensor Microarray and Method of Manufacturing Same", and which is incorporated herein by reference in its entirety.

SCOPE OF THE INVENTION

The present invention relates to a micromechanical system (MEMS) and its method of manufacture, and more particularly three-dimensional MEMS devices such as sensor microarrays which may function as part of a capacitive micromachined ultrasonic transducer (CMUT). In a preferred application, the present invention relates to an ultrasonic sensor microarray and its method of manufacture which incorporates or simulates a hyperbolic paraboloid shaped sensor configuration or chip, and which incorporates benzocyclobutene (BCB) as a structural component. Suitable uses for the CMUT include medical and other non-vehicular applications, as well as applications for vehicle or automotive sensor use, such as in the monitoring of vehicle blind-spots, obstructions and/or in autonomous vehicle drive and/or parking applications.

BACKGROUND OF THE INVENTION

In the publication *Design of a MEMS Discretized Hyperbolic Paraboloid Geometry Ultrasonic Sensor Microarray*, IEEE Transactions On Ultrasonics, Ferroelectrics, And Frequency Control, Vol. 55, No. 6, June 2008, the disclosure of which is hereby incorporated herein by reference, the inventor describes a concept of a discretized hyperbolic paraboloid geometry beam forming array of capacitive micromachined ultrasonic transducers (CMUT) which is assembled on a microfabricated tiered geometry.

In initial fabrication concepts for CMUTs, Silicon-on-Insulator (SOI) wafers were subjected to initial cleaning, after which a 10 nm seed layer of chromium is then deposited thereon using RF-magnetron sputtering to provide an adhesion layer. Following the deposition of the chromium adhesion-layer, a 200 nm thick gold layer is deposited using conventional CMUT deposition processes. After gold layer deposition, a thin layer of AZ4620 photoresist is spin-deposited on the gold layer, patterned and etched. The gold layer is then etched by submerging the wafer in a potassium iodine solution, followed by etching of the chromium seed layer in a dilute aqua regia, and thereafter rinsing. The device layer is thereafter etched further to provide acoustical ports for static pressure equalization within the diaphragm, and allowing for $SiO_2$ removal during a release stage.

A top SOI wafer is etched using a Bosch process deep reactive ion etch (DRIE) in an inductively coupled plasma reactive ion etcher (ICP-RIE). After metal etching with the Bosch and DRIE etch, the remaining photoresist is removed by $O_2$ ashing processing. Bosch etched wafer is submerged in a buffer oxide etch (BOE) solution to selectively etch $SiO_2$ without significantly etching single crystal silicon to release the selective diaphragms. Following etching and rinsing, the sensing surfaces (dyes) for each of the arrays are assembled in a system-on-chip fabrication and bonded using conductive adhesive epoxy.

The applicant has appreciated however, existing processes for the fabrication of capacitive micromachined ultrasonic transducers require precise manufacturing tolerances. As a result, the production of arrays of CMUT sensors or transducers on a commercial scale has yet to receive widespread penetration in the marketplace.

U.S. Pat. No. 6,942,750 to Chou et al., the entirety of which is incorporated herein by reference, describes a construct and process of patterned wafer bonding using photosensitive benzocyclobutene (BCB) in the fabrication of a 3D MEMS construction. In particular, Chou et al discloses the use of a light activated photosensitive BCB as an assembly adhesive used to effect precision patterning wafer bonding, with the resulting three dimensional MEMS microstructure achieved with BCB adhesive layers adding to the Z-height of the assembled wafer complex.

SUMMARY OF THE INVENTION

The inventor has appreciated new and/or more reliable CMUT array designs may be achieved by improved manufacturing methods and/or with adjustable operating frequencies. One non-limiting object of the present invention is to provide an ultrasonic sensor which incorporates one or more CMUT microarrays or modules for transmission and reception of signals, and which may be more immune to one or more of a variety of different types of ultrasound background noise sources, such as road noise, pedestrian, cyclist and/or animal traffic, car crash sounds, industrial works, power generation sources and the like.

In one construction, the present invention provides a three-dimensional MEMS device, and more preferably a CMUT transducer, which incorporates a silicon base wafer, a benzocyclobutene (BCB) resin, such as Cyclotene™, as a structural component in the Z-axis, and a silicon and/or BCB based diaphragm or membrane layer.

Another non-limiting construction provides an ultrasonic CMUT based microarray which provides programmable bandwidth control, and which allows for CMUT microarray design to be more easily modified for a variety of different sensor applications.

A further non-limiting construction provides an ultrasonic sensor which incorporates a transducer microarray module or sub-assembly which has a substantially flattened curvature, preferably which has a curvature less than ±10°, and more preferably less than about ±1°, and which in operation simulates a hyperbolic paraboloid shaped chip array geometry.

One embodiment of the invention provides a capacitive micromachined ultrasonic transducer (CMUT) based microarray module which incorporates a number of transducers. The microarray module is suitable for use in vehicle, as well as non-vehicle rail, aircraft and other sensor applications. For example the module may be provided as part of a hand or body position sensor, as well as in warning and/or control systems for monitoring blind-spots, adjacent obstructions and hazards, and/or in vehicle road position warning and/or autonomous drive applications.

Another embodiment of the invention provides a method far the manufacture of a CMUT based microarray of transducer/sensors, and more preferably CMUT based microarray modules, which are operable to emit signals over a number and/or range of frequencies, and which may be arranged to minimize frequency interference from adjacent sensors. In one possible preferred method of manufacture, conventional (i.e. non-photosensitive) benzocyclobutene (BCB), such as Cyclotene™ is used as an adhesive layer in the formation of a microarray as wafer construct. In on possible construction, BCB is further used to form the displaceable transducer membrane or diaphragm.

It is envisioned that one possible simplified and reliable method of manufacturing CMUT microarray module either simulating or provided in a hyperboloid parabolic geometry may use a molding, stamping or three dimensional (3D) printing process to form a backing or base on which microarrays of transducer modules are mounted. Further, by changing the orientation or operation of the individual CMUT microarray modules in the sensor array, it is possible to select preferred or provide variable output beam shapes.

In another non-limiting embodiment, the present invention provides a sensor assembly which is provided with one or more capacitive micromachined ultrasonic transducer (CMUT) microarrays modules which are provided with a number of individual transducers. In a non-limiting final sensor construction, the CMUT microarray modules are arranged so as to simulate or orient individual transducers in a generally hyperbolic paraboloid geometry. Other module arrangements and geometries are, however, possible.

Preferably, the sensor assembly includes at least one CMUT microarray module which incorporates a number of individual transducer/sensors, and which are activatable individually, selectively or collectively to emit and receive reflected signals. To minimize transmission interference, the transducer/sensors are most preferably arranged in a rectangular matrix within each module, and which may be simultaneously of selectively activated. More preferably multiple microarrays are provided in each sensor assembly. The microarrays are typically mounted in a square or rectangular matrix arrangement or 3×3 or more, and wherein each microarray module contains at least thirty-six and preferably at least two hundred individual ultrasonic transducer/sensors. Although not essential, in one simplified design, the sensor microarray modules are physical positioned on a three-dimensional backing which is formed to orient the microarray modules and provide the sensor array as a discretized, generally hyperbolic paraboloid shape. When provided for use in automotive applications, the hyperbolic paraboloid orientation of the modules is selected such that transducer/sensors operate to output a preferred beam field of view of between 15° and 40°, and preferably between about 20° and 25°.

The sensor transducers may operate with suitable frequency ranges may be as low as 40 kHz. In vehicle applications, more preferably the transducer/sensor for independent activation of each microarray is operable at frequencies of at least 100 kHz, and most preferably at about 150 kHz to minimize the effects of air damping. In a preferred construction, where the sensor assembly is provided for operation as vehicle blind-spot sensor, the sensor assembly is formed having a compact sensor design characterized by:

| Package size | PGA 68 stick lead mount |
|---|---|
| Update Rate | 50 to 100 ms, and preferably about 80 ms |
| Array Distribution | at least a 3 × 3; and preferably 5 × 5 Hyperbolic Paraboloid or greater |
| Beam Field of View | 15 to 170 Degrees or greater; and for automotive preferably 25 to 140 Degrees |
| Frequency Range | 50 to 200 kHz; and preferably 100 to 170 kHz |
| Detection Range Goal | 3.5 to 7 meters; and preferably about 5.0 meters |

It is to be appreciated that in other applications, different sized sensors with different numbers of microarray modules and beamwidths, and/or CMUT microarray modules containing greater numbers of individual transducer/sensors may be provided. Depending on the application, the individual transducer/sensors may exceed thousands or tens of thousands in numbers, having regard upon the overall sensor assembly size, the intended use and component requirements.

In another embodiment, the microarray modules are mounted to a backing in a substantially flat geometry and which preferably has a curvature of less than ±10°, and more preferably less than ±1°. Whilst sensor assemblies may include as few as a single microarray module, more preferably multiple CMUT microarray modules are provided, and which are arranged in a square matrix module arrangement of 5×5 or greater. Optionally, individual CMUT microarray modules may be formed as a generally flexible sheet which allows for free-form shaping, to permit a greater range of output beam shape and/or configurations.

Each microarray module itself is preferably provided with at least a 5×5, and preferably a 40×40 or greater sensor array of individual CMUT transducer/sensors. The transducer/sensors in each microarray module themselves may also be subdivided electrically into two or more groupings. In one simplified design, the transducers of each microarray module are oriented in a rectangular matrix and are electrically subdivided into multiple parallel rows and/or columns. Other subdivision arrangements are however, possible, including electrically isolating individual transducer/sensors for independent activation. The subdivision of the microarray transducers into parallel column or row groupings allows individual groups of transducer/sensors to be selectively coupled to a frequency generator and activated by group. More preferably, the sensor assembly is programmable to selectively activate or deactivate groupings of transducer/sensors within each CMUT microarray module.

In a further embodiment, the microarray modules in each sensor assembly may be configured for selective activation independently from each other. In this manner, the applicant has appreciated that it is possible to effect changes in the sensor assembly beam width, shape and/or the emitted wavelength dynamically, depending on the application and/or environment. More preferably, the CMUT microarray modules are adapted to electronically output beams having a variety of different beam shapes, lengths and/or profiles.

In one preferred mode of operation, the selective switching of power is effected to different combinations of groupings or columns of transducers in each module. The applicant has appreciated that by such switching, it is thus possible to alter the output shape of the transmitting signal emitted by the sensor assembly, as for example, to better direct the output signals from the sensor assembly to a target area of concern. In this manner, the output beam geometry may be configured to avoid false signals from other vehicles or outside sources; or to provide output beams which are scalable over a range of frequencies and/or beam widths to detect different types of obstacles, depending upon application (i.e. environment, vehicle speed, drive mode (forward versus reverse movement) and/or sensor use).

In a preferred mode of operation, power is selectively supplied to each individual CMUT microarray module within the sensor array matrix. In this manner, individual modules may be activated to effect time-of-flight object detection and/or locations. In addition, the selective control and activation of both the individual CMUT microarray modules, as well as groupings of transducer/sensors therein advantageously allows for a wide range of three-dimensional beam shaping, to permit wider sensor applications or needs.

In one possible construction, a microprocessor control is provided. The microprocessor control actuates the switching unit and unit frequency generator. More preferably, the microprocessor control actuates the switching unit and generator to effect a computerized sequence of combinations of columns and rows of transducers within each CMUT microarray module, and change the sensor assembly output signal shape, frequency over a pre-determined sequence or range. In this manner, it is possible to further differentiate or minimize interference and false readings from other automobile sensors which could be in proximity.

In the final design, an active silicon wafer part of the silicon wafer is used as the membrane of each CMUT transducer, with the base wafer forming the bottom silicon layer. The base and silicon top wafers are bonded using a structural layer of BCB as a principal bonding agent. The bonding process is preferably performed at 150° C. to drive out any residual solvents and to allow a maximum bonding strength. Bonded samples are then cured at 250° C. in nitrogen ambient for about 1 hour.

Accordingly, there are provided a number of non-limiting aspects of the invention and which include:

A method of forming a capacitive micromachined ultrasonic transducer (CMUT) for use in a microarray having a plurality of transducers, said method comprising, providing a first silicon-based wafer having a generally planar upper and lower surfaces, providing a second wafer as a device layer, said device layer having generally planar, parallel top and bottom surfaces, said device layer having thickness selected at between about 0.05 and 5 microns, and preferably between about 0.2 and 1 microns, forming a benzocyclobutene (BCB) layer over one of said upper surface or the bottom surface of said device layer, etching a surface of said BCB layer to form an etched surface having a plurality of pockets therein, each of said pockets having a preselected geometric shape, said pockets being characterized by respective sidewalls extending to a depth of between about 0.1 and 15 microns, preferably about 0.2 and 8 microns, and most preferably about 3 to 4 microns, and aligning a portion of the etched surface of the BCB layer and the other one of the upper surface or the bottom surface of the device layer, bonding said first wafer to said device layer with said BCB layer interposed therebetween, whereby said pockets form respective transducer air gaps, applying a conductive metal to at least one of the first wafer and the second wafer.

A method of forming a capacitive micromachined transducer for use in a microarray comprising a plurality of transducers, said method comprising, providing a silicon backing wafer having generally planar, parallel forward and rearward surfaces, said backing wafer having a thickness selected at between about 10 and 500 microns, forming a benzocyclobutene (BCB) structural layer over said forward surface, said structural layer having a thickness selected at between about 0.5 to 15 microns, and preferably between about 1 to 10 microns, and most preferably 3 to microns, photo-plasma etching a surface of said BCB structural layer to form a plurality of pockets therein, said pockets having a generally common geometric shape and being characterized by a respective sidewall extending generally normal to said front surface and extending to a depth of between about 0.1 and 10 microns, providing a device layer having generally planar, parallel opposing forward and rearward surfaces, said device layer having a thickness selected at between about 0.05 and 10 microns, preferably about 0.2 and 2 microns and most preferably less than 1 micron, positioning substantially contiguously bonding the rearward surface of the device wafer over the front surface to substantially seal each pocket as a respective transducers air gap, and wherein said device wafer is bonded relative to the first wafer with the BCB structural layer as a structural adhesive component, applying a conductive metal layer to at least part of at least one of the first wafer and the device wafer.

An ultrasonic sensor system for transmitting and/or receiving a sensor beam, the system including a frequency generator and a sensor assembly comprising, a backing, a plurality of capacitive micromachined ultrasonic transducer (CMUT) microarray modules, the microarray modules being disposed in a grid matrix orientation on said backing, each said microarray including, a plurality of transducers having a transducer air gap and a diaphragm member, the microarray modules comprising: a bottom silicon layer having a generally planar top and bottoms surfaces; a benzocyclobutene (BCB) structural layer having generally parallel planar forward and rearward surfaces, a plurality of pockets extending rearwardly into the forward surface of the BCB structural layer said pockets each respectively defining sides and a bottom of an associated transducer air gap and being oriented in an array and having a depth selected at between about 0.2 and 5 microns, preferably 3 to 4 microns and a width selected at between 5 and 200 microns, and preferably 10 to 50 microns and a device layer having front and rear surfaces, the device layer having a thickness selected at between about 0.1 and 25 microns, and preferably less than 1 micron, the BCB structural layer being interposed between a bottom of said device layer and said top surface of said bottom silicon layer with the device layer sealing each said pocket as an associated transducer diaphragm member, at least one first electrically conductive member electrically connected to one or more of said transducer diaphragm members, at least one second electrically conductive member interposed between said backing and the rear surface of said bottom silicon layer, the at least one first conductive member being electrically connectable to a ground or said frequency generator.

A method and/or sensor system according to any one of the preceding aspects, wherein said BCB layer comprises a BCB structural layer having a thickness greater than about 0.2 microns and said device layer comprises a silicon based device layer.

A method and/or sensor system according to any one of the preceding aspects, wherein said BCB layer comprises a BCB device layer comprises a BCB based device layer.

A method and/or sensor system according to any one of the preceding aspects, wherein said step of forming comprises forming said BCB structural layer on said upper surface of said first wafer; and maintaining said device layer as a substantially uncured BCB-based device layer prior to said step of bonding.

A method and/or sensor system according to any one of the preceding aspects, wherein prior to said step of etching, heating said BCB structural layer to partially cure said BCB to between about 30% to 70% of a fully cured state.

A method and/or sensor system according to any one of the preceding aspects, wherein said bonding step comprises heating the BCB structural layer to a fully cured state, and wherein BCB in said BCB structural layer adheres said first wafer to said device layer.

A method and/or sensor system according to any one of the preceding aspects, wherein said step of etching comprises photo-plasma etching.

A method and/or sensor system according to any one of the preceding aspects, wherein, after bonding, physically sectioning the bonded first wafer and the device wafer into individual microarrays, said microarrays comprising a square matrix of nine-by-nine transducers or greater.

A method and/or sensor system according to any one of the preceding aspects, further comprising applying a conductive metal layer to at least part of said top surface of said device layer or the lower surface of said first wafer, said metal being selected from the group consisting of gold, silver and copper, wherein said conductive metal layer has a thickness selected at between about 1 and 500 nanometers, and preferably between about 5 and 50 nanometers.

A method and/or sensor system according to any one of the preceding aspects, wherein said geometric shape comprises a generally square shape having width and length lateral dimensions selected at between about 5 to 100 microns, and preferably between about 10 to 40 microns.

A method and/or sensor system according to any one of the preceding aspects, wherein said step of forming said pockets comprises forming said pockets in a generally square matrix, wherein groupings of said pockets are aligned in a plurality parallel rows and/or columns.

A method and/or sensor system according to any one of the preceding aspects, wherein said step of applying said conductive metal layer comprises coating substantially the entirety of the top surface of the device wafer, and wherein after coating, selectively removing portions of said conductive metal layer to electrically isolate at least some of said groupings of said pockets from adjacent groupings.

A method and/or sensor system according to any one of the preceding aspects, wherein said step of applying said conductive metal layer comprises, prior to bonding, forming vias through said first wafer in an associated bottom region of respective ones of said pockets, and forming conductive metal pads in said associated bottom regions, wherein said conductive pads provide electrical communication with said lower surface of said first wafer through said via.

A method and/or sensor system according to any one of the preceding aspects, 13 further comprising electrically connecting groupings of said pockets to a switching assembly operable to selectively electrically couple said groupings to a effect stronger signal output.

A method and/or sensor system according to any one of the preceding aspects, wherein said step of forming said BCB structural layer comprises applying BCB to the upper surface of the first wafer with a substantially thickness of between about 1 and 50 microns, and preferably between about 2 and 5 microns, and most preferably between 3 and 4 microns.

A method and/or sensor system according to any one of the preceding aspects, wherein said step of forming said pockets comprises forming a square array of at least one hundred pockets, and preferably at least five hundred pockets, each of said pockets having a generally flat bottom region.

A method and/or sensor system according to any one of the preceding aspects, further wherein prior to said etching, mounting said second wafer to a handle wafer, and grinding and/or laser ablating said second wafer to form said device layer with a desired thickness.

A method and/or sensor system according to any one of the preceding aspects, wherein prior to forming said BCB structural layer, applying an adhesion promoter coating to at least one of said upper surface and bottom surface, said adhesion promoter coating having a thickness selected at less than about 50 nm.

A method and/or sensor system according to any one of the preceding aspects, wherein said device wafer comprises a silicon based device layer.

A method and/or sensor system according to any one of the preceding aspects, wherein said device wafer comprises a BCB based device layer.

A method and/or sensor system according to any one of the preceding aspects, wherein said step of forming comprises forming said BCB structural layer on said forward surface of said first wafer; and maintaining said device layer as a generally uncured BCB-based device layer prior to said step of bonding.

A method and/or sensor system according to any one of the preceding aspects, wherein prior to said step of etching, heating said BCB structural layer to partially cure said BCB to between about 30% to 70% and preferably about 50% of a fully cured state.

A method and/or sensor system according to any one of the preceding aspects, wherein said bonding step comprises heating the BCB structural layer to a fully cured state, and wherein BCB in said BCB structural layer adheres said first wafer to said device wafer.

A method and/or sensor system according to any one of the preceding aspects, wherein said step of etching comprises photo-plasma etching said BCB structural layer.

A method and/or sensor system according to any one of the preceding aspects, wherein after bonding, physically sectioning the bonded first wafer and the device wafer into individual microarrays, said microarrays comprising a matrix of at least nine-by-nine transducers or greater.

A method and/or sensor system according to any one of the preceding aspects, further comprising applying a the conductive metal coating to at least part of said forward surface of said device wafer or the rearward forward surface of said first wafer, said metal coating being selected from the group consisting of gold, silver, copper, and their alloys, and wherein said conductive metal layer has a thickness selected at between about 1 and 500 nanometers, and preferably between about 5 and 50 nanometers.

A method and/or sensor system according to any one of the preceding aspects, wherein said geometric shape comprises a generally square shape having a lateral dimension selected at between about 5 and 200 microns, and preferably 10 to 40 microns.

A method and/or sensor system according to any one of the preceding aspects, wherein said step of forming said pockets comprises forming said pockets in a generally square matrix, wherein groupings of said pockets are aligned in a plurality parallel rows and/or columns.

A method and/or sensor system according to any one of the preceding aspects, wherein said step of applying said conductive metal comprises coating substantially the entirety of the forward surface of the device wafer, and wherein after coating, selectively removing portions of said conductive metal coating to electrically isolate at least some of said groupings of said pockets from adjacent groupings.

A method and/or sensor system according to any one of the preceding aspects, wherein said step of applying said conductive metal coating comprises, prior to bonding, forming vias through said first wafer in associated bottom regions of respective ones of said pockets, and forming conductive pads in said associated bottom regions, wherein said conductive pads provide electrical communication with said lower surface of said first wafer through said via.

A method and/or sensor system according to any one of the preceding aspects, further comprising electrically connecting groupings of said pockets to a switching assembly operable to selectively electrically couple said groupings to a frequency generator.

A method and/or sensor system according to any one of the preceding aspects, wherein said step of forming said BCB structural layer comprises applying BCB to the forward surface of the first wafer as a substantially parallel layer having a thickness selected at between about 1 and 100 microns, and preferably between about 2 and 25 microns, and most preferably 3 to 4 microns.

A method and/or sensor system according to any one of the preceding aspects, wherein said step of forming said pockets comprises forming a square array of at least one hundred pockets, and preferably at least five hundred pockets, each of said pockets having a generally flat bottom.

A method and/or sensor system according to any one of the preceding aspects, further wherein prior to said etching, mounting said device wafer to a handle wafer, and grinding and/or laser ablating said device wafer device layer to a desired thickness.

A method and/or sensor system according to any one of the preceding aspects, wherein prior to forming said BCB structural layer, applying an adhesion promoter coating to at least one of said forward surface of said first wafer and a rearward surface of said device wafer, said adhesion promoter coating having a thickness selected at less than about 50 nm, and wherein said adhesive promoter coating is selected to bonding of said BCB structural layer.

A method and/or sensor system according to any one of the preceding aspects, further comprising, providing a sensor backing platform, said backing platform including a generally square mounting surface having a width selected at between about 0.5 and 10 cm, following bonding, dividing said bonded first wafer and device layer into a plurality of CMUT transducer microarrays modules comprising a plurality of transducers, each microarray module having a generally geometric shape and having an average width of between about 1 mm and 2 mm, mounting a selected transducer microarray modules on said mounting surface.

A method and/or sensor system according to any one of the preceding aspects, wherein said step of mounting comprises mounting said CMUT transducer microarray modules to said backing platform in a generally square array.

A method and/or sensor system according to any one of the preceding aspects, further comprising forming said backing platform from ABS having a generally flat module mounting surface.

A method and/or sensor system according to any one of the preceding aspects, further comprising forming said backing platform with a discretized hyperbolic paraboloid mounting surface, said hyperboloid paraboloid mounting surface including a plurality of discrete planar surfaces for receiving an associated one of said microarray modules thereon, and further mounting selected ones of said CMUT transducer microarray modules on an associated one of said discrete planar surface.

A method and/or sensor system according to any one of the preceding aspects, wherein the step of applying the conductive metal layer comprises sputtering a layer of a metal selected from the group consisting of gold, silver, and copper, wherein said first conductive metal layer has a thickness selected at between about 100 and 500 nanometers, and preferably about 100 nanometers.

A method and/or sensor system according to any one of the preceding aspects, wherein said step of etching said pockets comprises plasma etching said pockets in an array of generally square or rectangular matrix, wherein said transducers in each microarray module are aligned in a plurality parallel rows and columns.

A method and/or sensor system according to any one of the preceding aspects, wherein said device layer comprises a silicon-based layer having a thickness selected at between about 0.2 and 5 microns and preferably less than 1 micron.

A method and/or sensor system according to any one of the preceding aspects, wherein said device layer comprises a BCB layer having a thickness selected at between about 0.2 and 5 microns, and preferably less than 1 micron.

A method and/or sensor system according to any one of the preceding aspects, wherein said BCB structural layer has a thickness selected at between about 1 micron and 40 microns, and preferably between about 3 microns and 4 microns, and wherein the BCB structural layer has a thickness between adjacent ones of said air gaps selected at at least one-half the depth of the pockets.

A method and/or sensor system according to any one of the preceding aspects, wherein said pockets comprise generally square-shaped pockets oriented in a generally square matrix array.

A method and/or sensor system according to any one of the preceding aspects, further comprising an adhesion promoter coating interposed between part of said BCB structural layer and at least one of said bottom silicon layer and said device layer.

A method and/or sensor system according to any one of the preceding aspects, comprising a plurality of said first electrically conductive members, said first electrically conductive members, said first electrically conductive members each electrically connecting an associated grouping of said transducer diaphragm members in each CMUT microarray, and further including, a switching assembly activatable to selectively connect said frequency generator to one or more of said first electrically conductive members to selectively activate associated groupings of transducers.

A method and/or sensor system according to any one of the preceding aspects, wherein each of the first and second conductive members comprise a conductive metal coating.

A method and/or sensor system according to any one of the preceding aspects, wherein each said grouping comprises a columnar grouping of said transducers.

A method and/or sensor system according to any one of the preceding aspects, wherein said array comprises a generally square-shaped array of at least 25 pockets, preferably at least 100 pockets, and more preferably at least 400 pockets.

A method and/or sensor system according to any one of the preceding aspects, wherein the sensor assembly comprises a programmable vehicle park assist or blind-spot sensor.

A method and/or sensor system according to any one of the preceding aspects, wherein the transmitted sensor beam has a frequency selected at between 50 to 200 kHz, and preferably about 150 and 163 kHz.

A method and/or sensor system according to any one of the preceding aspects, wherein an ultrasonic sensor system for transmitting and/or receiving a sensor beam, the system including a frequency generator and a sensor assembly comprising, a plurality of capacitive micromachined ultrasonic transducer (CMUT) microarray modules, the microarray modules being disposed in a generally matrix orientation, each said microarray module including, a plurality of capacitive micromachined transducers having a transducer air gap and a diaphragm member, the capacitive micromachined transducers being formed by the method, and wherein the microarray modules comprise: a bottom silicon layer having a generally planar top surface, a BCB structural layer provided over said top surface and having a plurality of square-shaped pockets formed therein, said pockets each respectively defining sides and a bottom of an associated said transducer air gap and being oriented in a generally square shaped array and having a depth selected at between about 0.2 and 10 microns, and preferably 3 to 4 microns, and a width selected at between 5 and 100 microns, and preferably 10 to 40 microns, and a top device layer overlying said BCB structural layer, the device layer sealing each said pocket as an associated said transducer diaphragm member and having a thickness selected at between about 0.1 and 5 microns, and at least one electrically conductive member extending over part of one of said diaphragm members and being electrically connectable to a ground or said frequency generator.

A method and/or sensor system according to any one of the preceding aspects, including a plurality of said electrically conductive members, said electrically conductive members electrically connecting a grouping of a plurality of said transducers in each CMUT microarray, operating to generate a wider range output frequencies.

A method and/or sensor system according to any one of the preceding aspects, wherein each said grouping comprises a columnar grouping of said transducers.

A method and/or sensor system according to any one of the preceding aspects, including a plurality of said electrically conductive members, said electrically conductive members electrically individually connecting an associated said transducer in each CMUT microarray.

A method and/or sensor system according to any one of the preceding aspects, wherein said square shaped array comprises an array of at least 25 pockets, and preferably at least 400 pockets.

A method and/or sensor system according to any one of the preceding aspects, wherein the sensor beam has a frequency selected at between 50 to 200 kHz and preferably about 150 and 163 kHz.

A method and/or sensor system according to any one of the preceding aspects, where said device layer comprises a silicon wafer having a thickness selected at between about 0.2 and 4 microns, and preferably less than 1 micron.

A method and/or sensor system according to any one of the preceding aspects, wherein said device layer consist substantially of a BCB layer having a thickness selected at between about 0.2 and 4 microns and preferably less than 1 micron.

BRIEF DESCRIPTION OF THE DRAWINGS

Reference may be had to the following detailed description, taken together with the accompanying drawings, in which.

DETAILED DESCRIPTION OF THE PREFERRED EMBODIMENTS

(i) 5×5 Array

Figure 1:
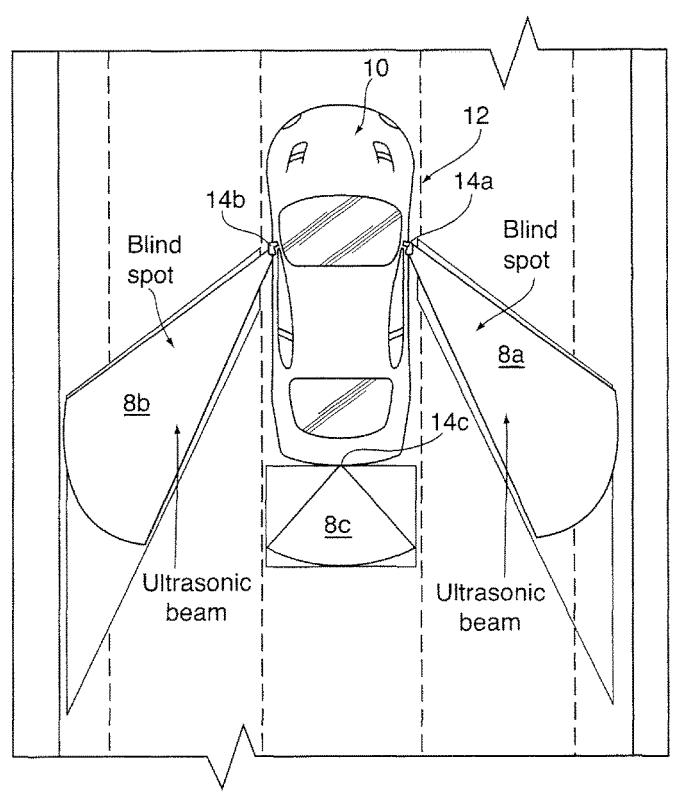
FIG. 1 shows schematically an automobile illustrating the placement of CMUT based ultrasonic sensor assemblies therein, and their desired coverage area, as part of a vehicle safety monitoring system for monitoring vehicle blind-spots.

Reference may be had to FIG. 1 which illustrates schematically a vehicle 10 having an ultrasonic based obstruction monitoring system 12 in accordance with a first embodiment. The monitoring system 12 incorporates a series of ultrasonic sensors assemblies 14a,14b,14c which are each operable to emit and receive ultrasonic beam signals across a respective vehicle blind-spot or area of concern 8a,8b,8c, to detect adjacent vehicles and/or nearby obstructions, or encroachments in protected areas.

Figure 2:
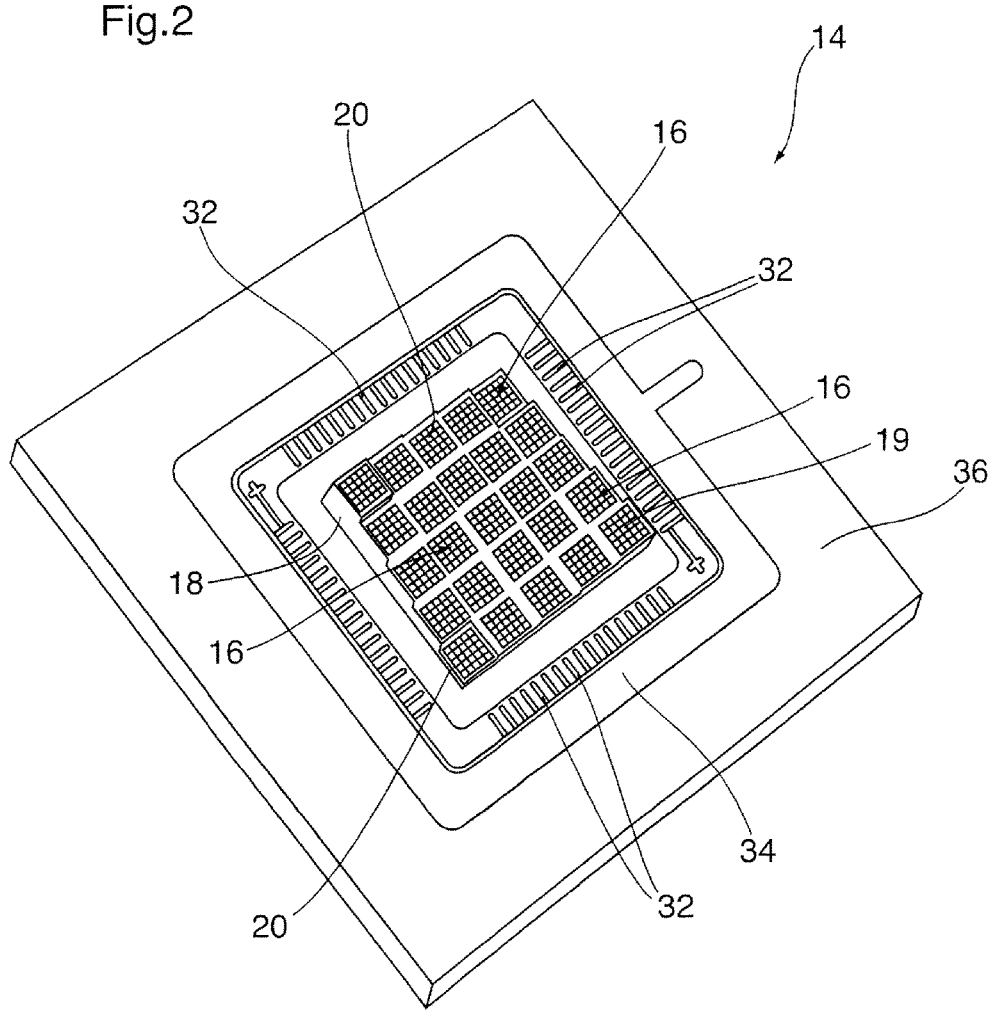
FIG. 2 illustrates an ultrasonic sensor assembly which includes a 5×5 construct of CMUT microarray modules used in the monitoring system of FIG. 1, in accordance with a first embodiment of the invention.
Figure 3:
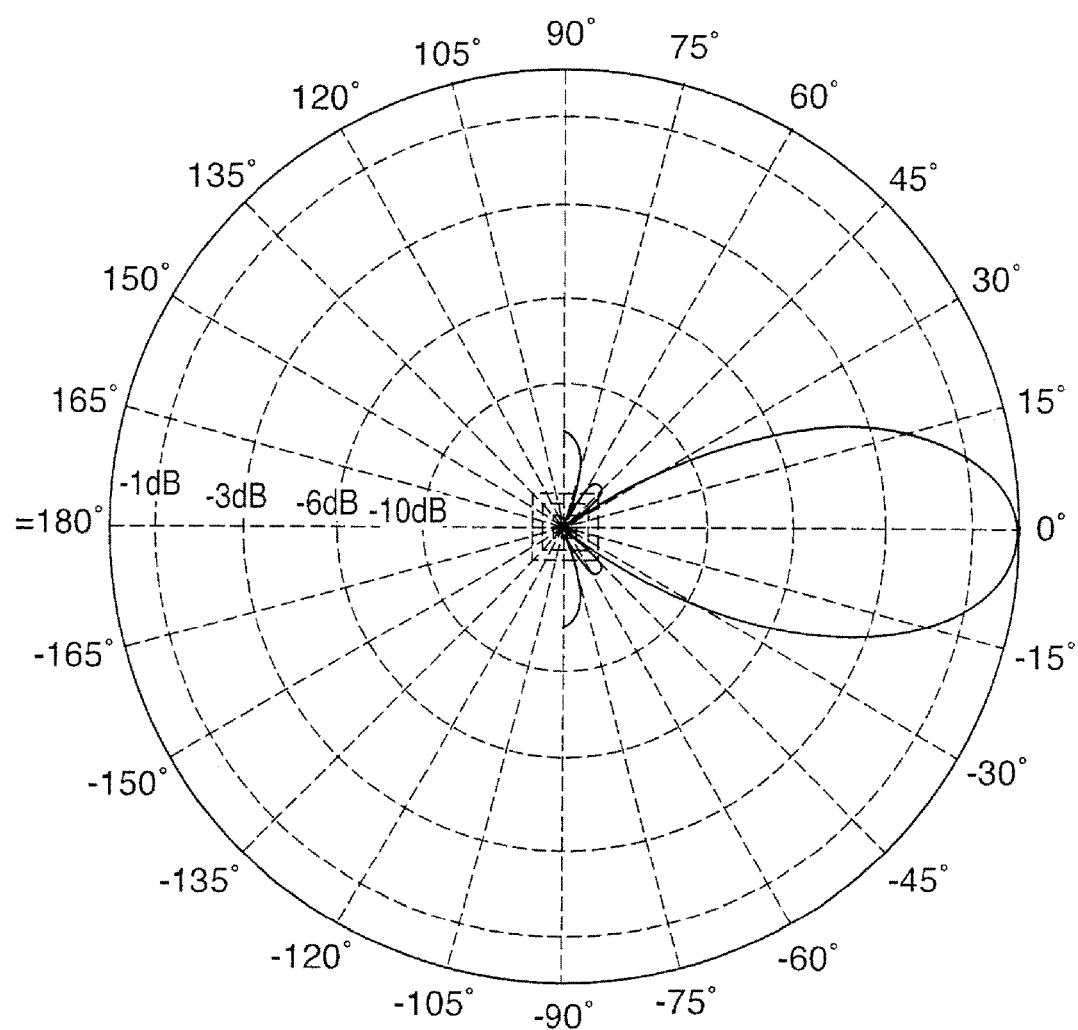
FIG. 3 illustrates a polar plot of the beam output geometry of the 5×5 construct of CMUT microarray module shown in FIG. 2.

Each sensor assembly 14 is shown best in FIG. 2 as incorporating an array of twenty-five identical capacitive micromachined ultrasonic transducer (CMUT) microarray modules 16. As will be described, the microarray modules 16 are mounted on a three-dimensional base or backing platform 18, with the forward face or surfaces 19 of the microarray modules 16 oriented in a generally hyperbolic paraboloid geometry. FIG. 2 shows best each of the CMUT microarray modules 16 in turn, as formed from thirty-six individual CMUT transducer/sensors 20 (hereinafter also transducers) which in operation output and receive a generally elongated ultrasonic signal beam (FIG. 3). In one embodiment, transducers 20 are positioned within a 6×6 (not shown to scale) rectangular or square matrix or grid arrangement within the individual microarray module 16.

Figure 4:
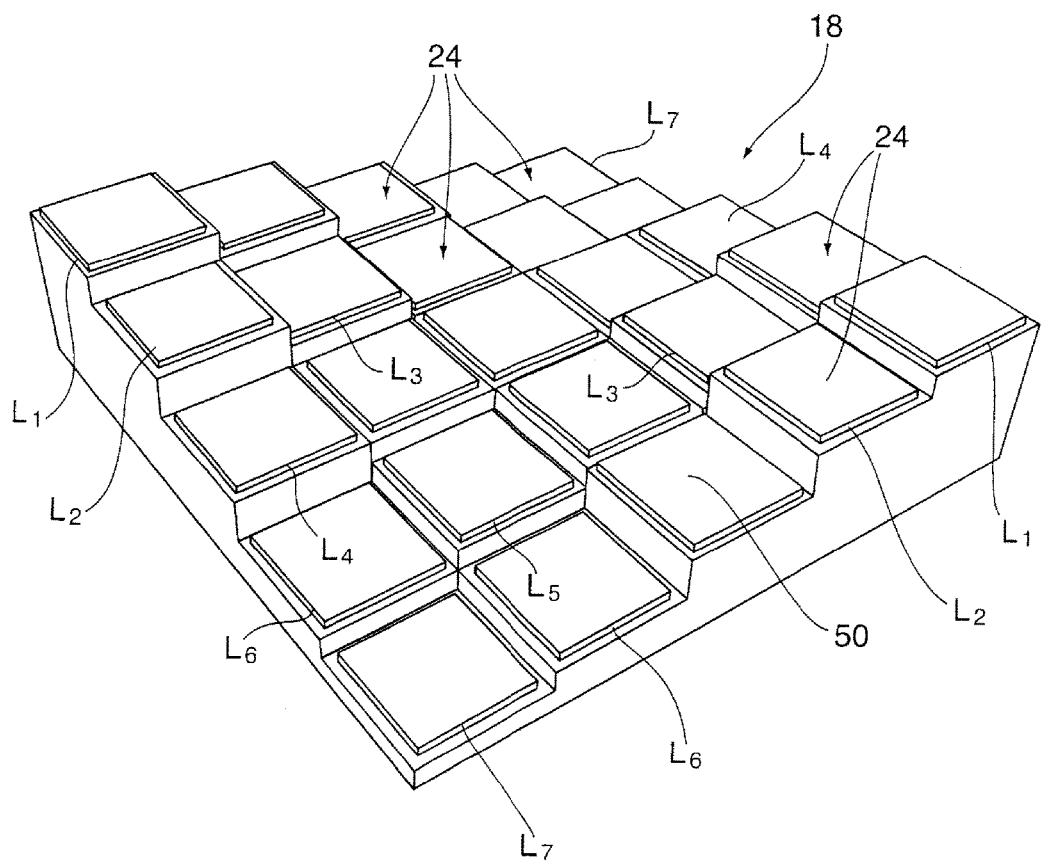
FIG. 4 illustrates a sensor backing platform for the 5×5 construct showing the twenty-five CMUT microarray module elevations used to approximate a continuous hyperbolic paraboloid surface.

FIG. 4 shows best the three-dimensional backing platform 18 as constructed as having a number of module mounting surfaces 24 which are positioned at selected levels $L_1$, $L_2$, ... $L_n$ relative to each other in a discretized generally hyperbolic paraboloid shape selected to simulate the generally continuous curving hyperbolic paraboloid curvature. In simplified form of manufacture, the backing platform 18 is formed as a three-dimensional plastic or silicon backing which presents twenty-five separate discrete planar square mounting surfaces 24. In this regard, the three-dimensional chip 36 may be assembled using a backing platform 18 formed from plastic, and more preferably acrylonitrile butadiene styrene (ABS), that is formed to shape by means of a 3D printing process. In an alternate production method the 3D chip backing platform 18 may be formed by injection molding through micro-molding injection molding processes. Each mounting surface 24 has a co-planar construction and a complimentary size selected to receive and support an associated CMUT microarray module 16 thereon. In this manner, the CMUT microarray modules 16 are themselves mounted on the three-dimensional backing platform 18, with the raised geometry of the mounting surfaces 24 orienting the array of microarrays 16 in the desired generally discretized hyperbolic paraboloid geometry.

In one possible construction, where the backing platform 18 is provided for use with rear-grounded CMUT microarray modules 16, the backing platform 18 is provided with an electrically conductive gold or copper top face coating layer 50 which functions as a common ground layer for each module transducer 20. The backing layer 18 in turn is electrically gold bonded to suitable pin connectors 32 (FIG. 2) used to mount the pin base 34 as the sensor chip 36 used in each sensor assembly 14a,14b,14c. In manufacture, the backing platform 18 having the desired discretized formed three dimensional surface (and preferably formed of ABS plastic) is coated with a suitable conductive metal deposited coating layer 50 using sputtering, electroplating, electroless plating/coating, plasma coating and/or other metalizing processes. The mode of metal deposition is selected to enable placement of a continuous controlled layer of conductive metal over the top face of the ABS plastic backing platform 18, as formed. The conductive metal coating layer 50 is selected to provide a ground conductor for one side of the transducers 20 within each microarray module 16. Preferred metals for deposition include copper, gold, silver, aluminum or other highly electrically conductive metals.

Each CMUT microarray module 16 is thereafter positioned and adhered with a conductive adhesive directly on to an associated mounting surface 24 in electrical contact with the conductive metal coating layer 50 of the backing platform 18, with the backing platform 18 mounted to the pin base 34 using the pin connectors 32. It is to be appreciated that where the backing platform 18 is to be used with top-grounded modules 16, the top face coating layer 50 may be omitted, and suitable transducer connector traces may be provided to provide electrical connections with the module transducer 20. In an alternate design, a single base may be provided which is made entirely of a conductive metal, such as copper or gold.

The applicant has appreciated that by varying the curvature simulated by the relative positioning of the mounting surfaces 24 in different hyperbolic paraboloid configurations, it is possible to vary the output beam geometry of the sensor chip 36, to tailor it to a desired application. By way of example, where the sensor assembly 14 is used as backup vehicle sensor 14c (FIG. 1), the backing platform 18 may be provided with a flatter hyperbolic paraboloid curvature selected to produce comparatively wider, shorter beam signals. In contrast, sensor assemblies 14a,14b may be provided with a backing platform 18 having a relatively higher degree of curvature, to output narrower, longer beam signals.

In a most simplified construction, the 6×6 array of individual transducers 20 within each CMUT microarray module 16 present a generally planar forward surface 19 (FIG. 2) which functions as a signal emitter/receptor surface for the generated ultrasonic signals. In use, the individual transducers 20 are electronically activated to emit and then receive ultrasonic beam signals which are reflected by nearby vehicles and/or obstructions. In this manner, depending on the timing between signal emission, reflection and reception and/or the intensity of the reflected ultrasonic signals which are detected by each microarray module 16, the monitoring system 12 may be used to provide either an obstruction warning, or in case of auto-drive applications, control the vehicle operation speed and/or direction.

As shown best in FIG. 3, where used in vehicular applications the individual CMUT microarray modules 16 are concurrently operable to transmit and receive a beam signal at a frequency at a range of between about 113-167 kHz. Most preferably in rain or fog environments the modules 16 operate with signal frequencies of about 150 kHz±13, and a beamwidth of 20±5° with a maximum sidelobe intensity of −6 dB. The sensor microarray module 16 may provide frequency independent broadband beam forming, without any microelectronic signal processing.

In the construction of each ultrasonic sensors assembly 14, each CMUT microarray module 16 used in the monitoring system 12 preferably is formed having a footprint area of from about 1 to 5 mm$^2$, and a height of about 0.5 to 2 mm. In the 5×5 matrix arrangement shown in FIG. 2, the sensor chip 36 thus houses 900 individual transducers 20 in twenty-five microarray groupings of thirty-six, at seven discrete elevation levels, $L_{1-7}$ (FIG. 4), in the 5×5 matrix distribution.

Figure 5:
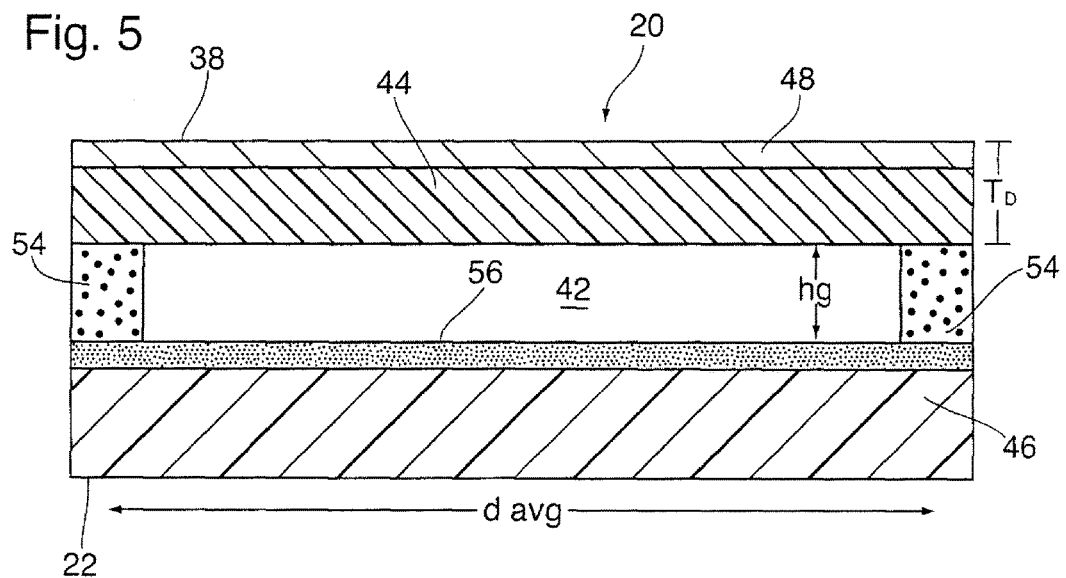
FIG. 5 provides an enlarged cross-sectional view of an individual CMUT transducer used in the ultrasonic sensor CMUT microarray module shown of FIG. 2, in accordance with a first manufacture.

FIG. 5 shows best an enlarged cross-sectional view of an individual rear grounded transducer 20 found in each CMUT microarray module 16 manufactured in accordance with a first embodiment of the invention. The transducer 20 is provided with a generally square-shaped central air cavity or air gap 42. The transducers 20 each have an average square lateral width dimension $d_{avg}$ selected at between about 20 and 50 µm, and preferably about 30 µm, with the interior air gap 42 extending with a height $h_g$ in the vertical Z-axis direction between about 60 and 80% of the lateral width of the transducer 20. The transducer 20 includes as principal structural components a top-most conductive gold conductive layer 48, a displaceable silicon device layer or diaphragm membrane 44, a silicon bottom layer or wafer 46, and intermediate benzocyclobutene (BCB) layer 54 which is provided as a structural layer, and which defines the lateral dimensions of the air gap 42, and is formed with a thickness (in the Z-axis direction) to provide the desired air gap height $h_g$. The air gap 42 is thus defined at its lower extent by the silicon bottom layer 46, and which depending on manufacture may or may not be provided with an adhesion promoter coating 56, such as AP3000™ to facilitate adhesion of the BCB layer 54 thereto. The air gap 42 has a height $h_g$ selected at between about 800 to 1000 nm, and more preferably about 900 nm. The diaphragm membrane 44 overlies the air gap 42, and preferably has a thickness of 0.5 to 1 µm, and preferably about a 0.8 µm, however thicker or thinner diaphragm membranes could also be used.

In one mode of manufacture, the gold conductive layer 48 is coated over the diaphragm membrane 44 of the transducers 20 in each microarray module 16 by electrodeposit and forms the forward surface 38 of each transducer 20. The conductive layer 48 thickness is selected so as not to interfere with diaphragm 44 movement and preferably which is selected at about 0.1 to 0.2 µm. In addition, the bottom conductive coating 50 maybe provided either directly along a rear surface 22 of the silicon bottom wafer or layer 46 of each transducer 20, or as described may be pre-applied over each mounting surface 24 of the backing platform 18. In this manner, by electrically coupling the top conductive layer 48 of each microarray module 16 and the conductive coating layer 50 on the backing platform 18 to a frequency generator (shown as 70 in FIG. 9), the diaphragm membranes 44 of the transducers 20 may be activated to emit and/or receive and sense generated ultrasonic signals.

Figure 9:
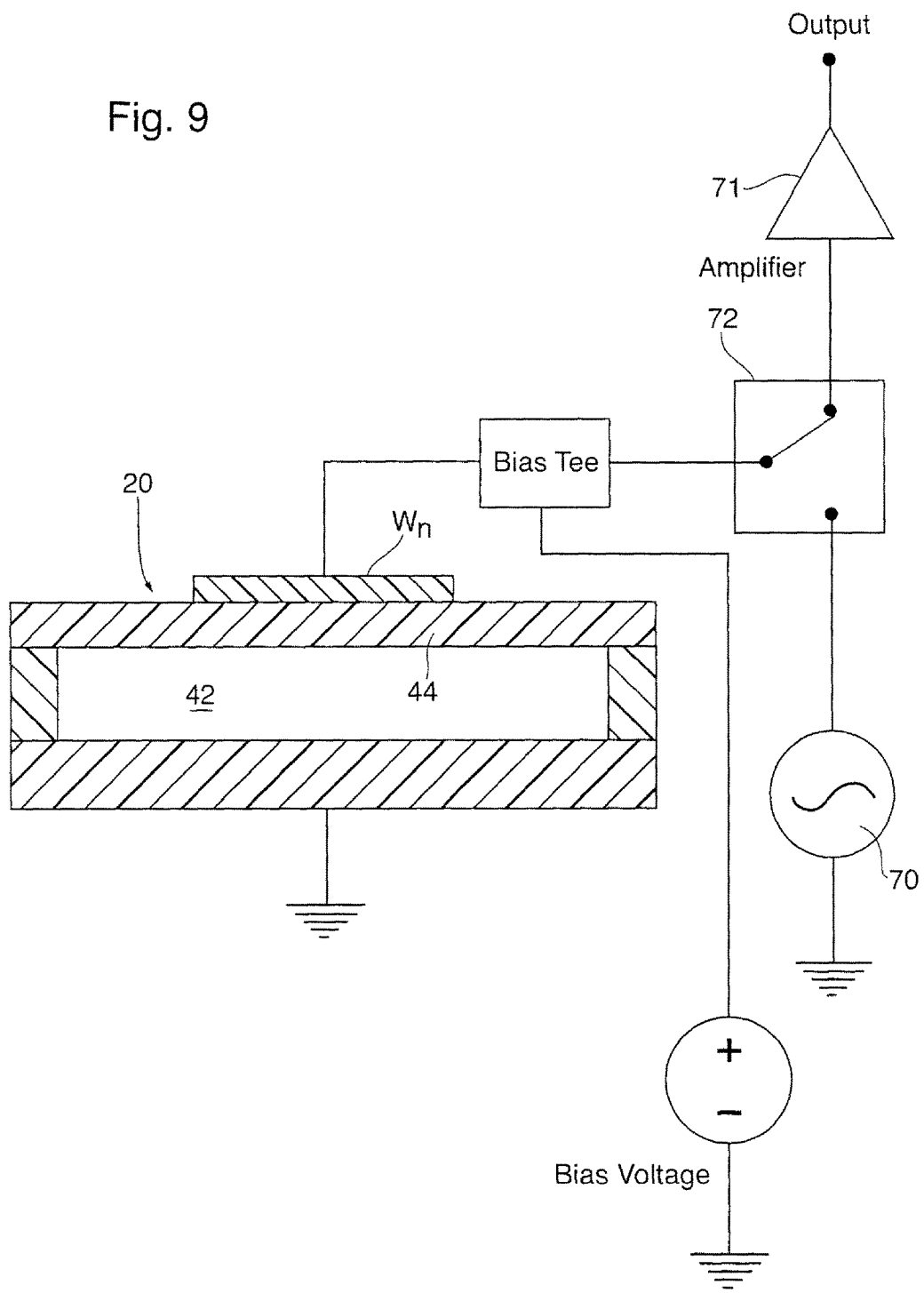
FIG. 9 illustrates schematically the operation of the individual transducer/sensors of the CMUT microarray modules shown in FIG. 7.

As will be described in one possible method of manufacture, the microarray modules 16 of the transducers 20 may be fabricated using a silicon-on-insulator (SOI) technology, used to preform individual component halves with the three-dimensional backing platform 18 formed of silicon. The modules 16 and backing platform 18 are assembled and packaged in a programmable gain amplifier PGA-68 package 71 (FIG. 9). The present invention also provides for a more simplified method of manufacturing the three-dimensional hyperbolic paraboloid chip 36 construct, and more preferably wherein the hyperbolic paraboloid chip 36 functions with the hyperbolic paraboloid geometry capacitive micromachined ultrasonic transducer.

In a simplified construction, the forward surface 38 of the transducer sensors 20 in each microarray module 16 provide a generally planar surface. The invention is not, however, so limited. In an alternate construction, the forward surface 38 of each microarray module 16 may be provided with or adapted for curvature. In such an arrangement, the transducers 20 within each of the CMUT microarray module 16 are themselves assembled directly on a flexible and compliable bottom or backing substrate (not shown). Such a backing substrate is selected from a material and having a thickness to allow microarray module 16 to be flexed or bent to better conform to an actual 3D hyperbolic paraboloid surface as a continuous free-form surface, as opposed to stepped surfaces that approximate such a free-form surface. Preferred flexible backings for the microarray modules 16 could include a monolithic silicon wafer 80 (FIG. 11) used to form the backing layer 46 of each module 20 themselves having thicknesses of less than about 5 µm, and preferably less than 1 µm, as well as separate or alternate backing layers made from Cylothane™ or bisbenzocyclobutene (BCB). Such a free-form surface advantageously also would allow the flexible backing of each CMUT microarray module 16 to be placed directly onto a free-form molded backing platform 18, providing the sensor chip 36 with a more accurate approximation of an actual hyperbolic paraboloid surface topography.

The inventor has recognized that when used as part of a vehicle monitoring system 12, the operating range of the CMUT microarray modules 16 may prove to have increased importance. Although not essential, preferably, to design for a specific range, distance damping and absorption attenuation of the air at the specific operating point is determined. Damping of sound is generally known to be calculated with the theory of the air damping (air resistance) as below:

$$P_{SPLdamping} = -20 \log_{10}(R_1/R_2)$$

Where $R_1$ is 30 cms for SPL standardization purposes, and $R_2$ is the maximum distance to reach. For 5 m of distance, the ultrasound should travel 10 m. Solving the equation yields −30 dB of damping in 10 m distance. Also, the absorption of the air due to humidity is calculated as follows:

$$\alpha(f) = 0.022f - 0.6 \text{ dB/ft}$$

Where α is the air absorption due to frequency f. The humidity is taken as 100% for the worst case scenario. Over the range of 10 m after conversion from ft, this absorption value is calculated to be −53 dB for 150 kHz.

It is therefore to be recognized when the total values there may exist significant damping of −83 dB. In contrast, the applicant has recognized that if the transducers 20 were operated in 60 kHz, total damping and absorption would be −51 dB, which will allow a much powerful received ultrasound signal.

In the construction of FIG. 2, after obtaining the total damping and absorption values, the individual transducers 20 are designed accordingly. In particular, since the total damping values add up to −83 dB, the CMUT transducers 20 are most preferably designed to have very high output pressure, and most optionally 100 dB SPL or more. It has been recognized that preferably the diaphragm membrane 44 (FIG. 5) of the CMUT transducers 20 is chosen with a thickness ($T_D$) (FIG. 5) less than 20 µm, preferably less than 5 µm, and most preferably about 1 µm. The selected membrane dimensions allow the diaphragm membrane 44 to have a large distance for vibration, and a lower DC operating voltage.

Also following Mason's theory, (see *Design of a MEMS Discretized Hyperbolic Paraboloid Geometry Ultrasonic Sensor Microarray*, IEEE Transactions On Ultrasonics, Ferroelectrics, and Frequency Control, Vol. 55, No. 6, June 2008, the disclosure of which is incorporated hereby reference), in automobile sensor applications, each CMUT transducer 20 is designed to operate over a frequency range of 110 to 163 kHz, and with the sensor assembly 14 having twenty-five microarray modules 16 in accordance with specifications shown in Table 1. A most preferred operating frequency is selected at about 150 kHz±13, with the 5×5 array of CMUT microarray modules 16 designed with a 40°−3 dB bandwidth and side lobes lower than −10 dB, as shown in FIG. 3. In this regard sound pressure can be found following the equation:

$$P_a = Re(Z_m) \omega A_a$$

Where $A_a$ is the amplitude of the acoustic wave, which is equal to the displacement of the CMUT membrane, ω is the angular frequency of the diaphragm and $Z_m$ is acoustic radiative impedance of the membrane obtained from Mason's method reference above.

TABLE 1

CMUT Sensor Array specifications - AUTOMOTIVE VEHICLE SENSOR

| Parameter | Value |
| --- | --- |
| Module Array | 5 × 5 |
| Array −3 dB beamwidth (°) | 40° |
| Sensor sidelength (mm) | 15.75 |
| CMUT microarray module sidelength (mm) | 1.6-1.8 |
| CMUT transducer diaphragm material | Low resistivity polysilicon |
| CMUT transducer sidelength (mm) | 0.25-0.3 |
| CMUT transducer diaphragm thickness (µm) | 0.5-1.0 |
| CMUT transducer resonant frequency (kHz) | 150 (±13) |
| CMUT transducer air-gap (µm) | 2.5-4 |
| Array pressure output (dB SPL) | 102.5 |
| CMUT bias voltage ($V_{DC}$) | 40 |
| CMUT pull-in voltage ($V_{DC}$) | 51 |
| CMUT receive sensitivity (mV/Pa) | 60 |
| Received signal at 10 m (mV) | 2 |

Table 1 above overviews the sensor array specifications of a prototype automotive vehicle sensor used as a backup sensor to provide obstruction warning signals.

Figure 6:
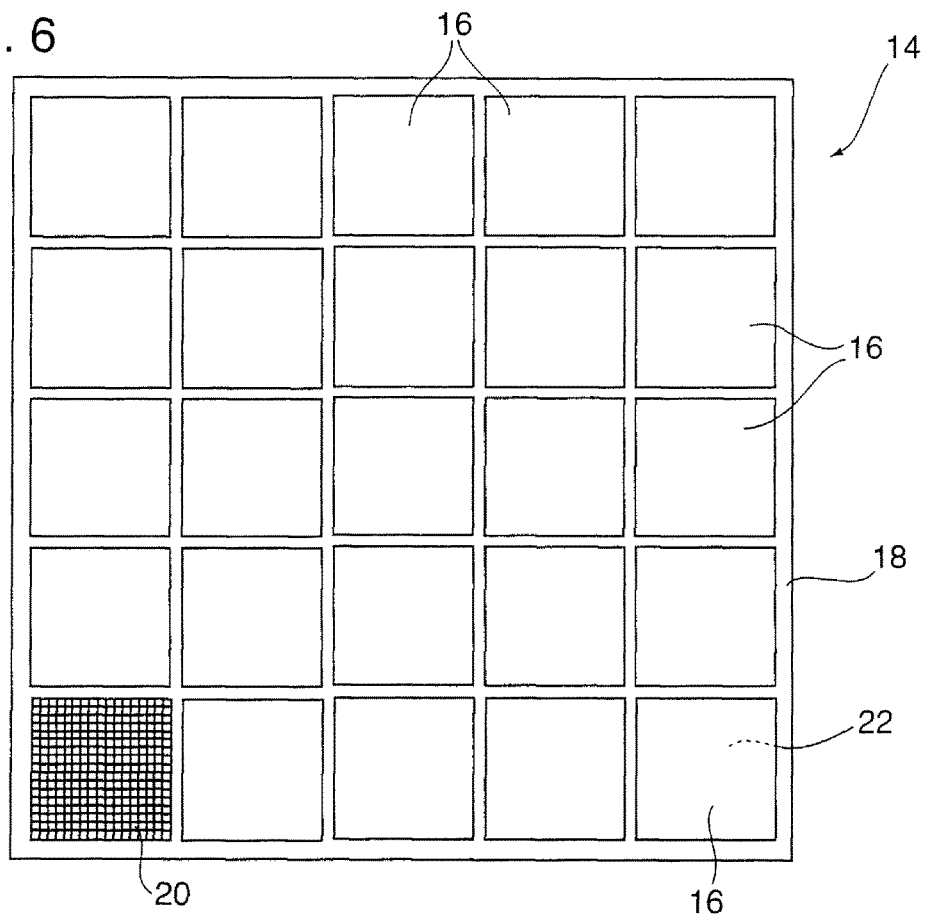
FIG. 6 illustrates schematically an ultrasonic sensor assembly having a 5×5 array construct of twenty-five CMUT microarray modules in accordance with another embodiment of the invention.

FIG. 6 illustrates an ultrasonic sensor assembly 14 in accordance with another embodiment of the invention, in which like reference numerals are used to identify like components. In FIG. 6, the ultrasonic sensor assembly 14 is provided with a 5×5 square array of twenty-five CMUT microarray modules 16. Each of the CMUT microarray modules 16 are in turn formed as a square 40×40 matrix of 1600 individual transducers 20 (not shown to scale). While FIG. 6 illustrates the sensor assembly 14 as including twenty-five CMUT microarray modules 16 arranged in a 5×5 matrix configuration, more precise manufacturing processes permit the development of sensor assemblies having greater numbers of microarray modules 16. As such, fewer or more transducers 20 may be provided in differing orientations. Such configurations would include without limitation rectangular strip, generally circular and/or to the geometric or amorphous groupings of modules; as well as groupings of forty-nine or fifty-four CMUT microarray modules 16 mounted in 7×7, 9×9, 10×10 or other square arrangements.

In one possible embodiment the 40×40 CMUT microarray modules 16 are secured to an ABS backing platform 18 which has a geometry similar to that shown in FIG. 4, and which has been discretized in about a 2×2 mm, and preferably 1.7×1.7 mm flat mounting surfaces 24. In such a construction, the backing platform 18 is formed as an approximated hyperbolic paraboloid surface in the manner described above.

In an alternate design, the backing platform 18 is made as a substantially flat ABS construct, having a hyperbolic paraboloid curvature less than about ±10°, preferably less than about ±1°, and more preferably less than ±0.5°, wherein one or more of the transducers 20 within each CMUT microarray module 16 is operable to more closely simulate their mounting in a hyperbolic paraboloid geometry. In one construction, the microarrays modules 16 are electrically bonded on their rearward side surface 22 to the conductive metal coating layer 50 which has been bonded as a metal layer deposited on the ABS backing platform 18 in the manner as described above. In a simplified construction, a top metal conductive layer 48, as shown in FIG. 5, is provided as the second other power conductor for the CMUT transducers 20, allowing each microarray 16 to operate in both send and receive mode. In an alternate design, the electrically conductive ground layer 50 could be applied to the forward surface 38 of each microarray module 16 over the diaphragm 44, in place of the conductive layer 48, or alternately with layer 48 acting as the ground. In such a configuration, conductive metal layers or contact pads may be included on the rear surface 22 bottom layer 46, or more preferably within individual transducer cavities 42, and which are electronically coupled to the frequency generator 70 for transmitting and receiving signals. Alternatively, the transducers 20 of each module 16 may be electrically connected in discrete groupings or individually to the frequency generator 70 for operation singularly or in selective groupings.

Figure 7:
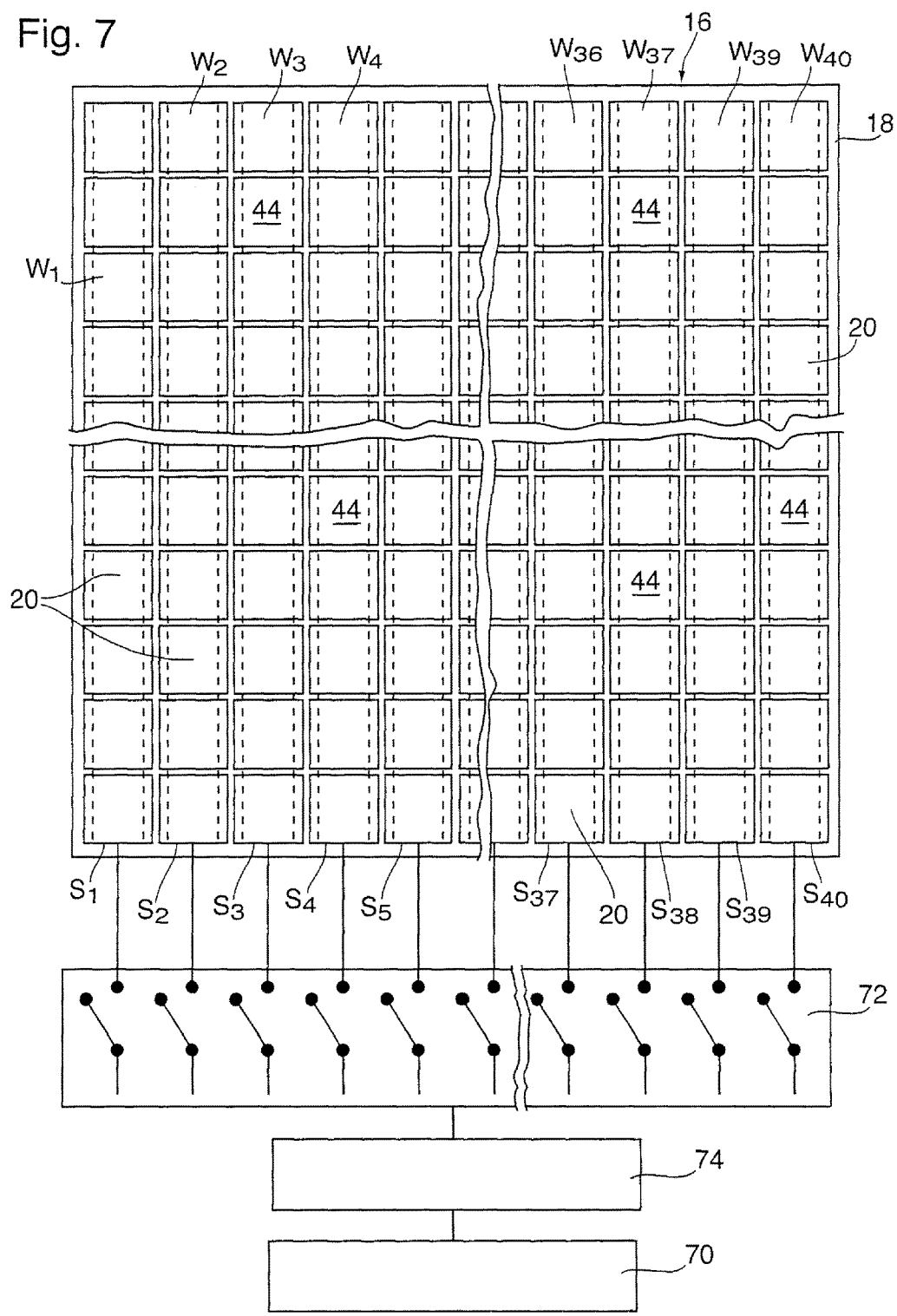
FIG. 7 illustrates schematically an enlarged view of an individual CMUT microarray module used in the ultrasonic sensor array of FIG. 6.
Figure 10:
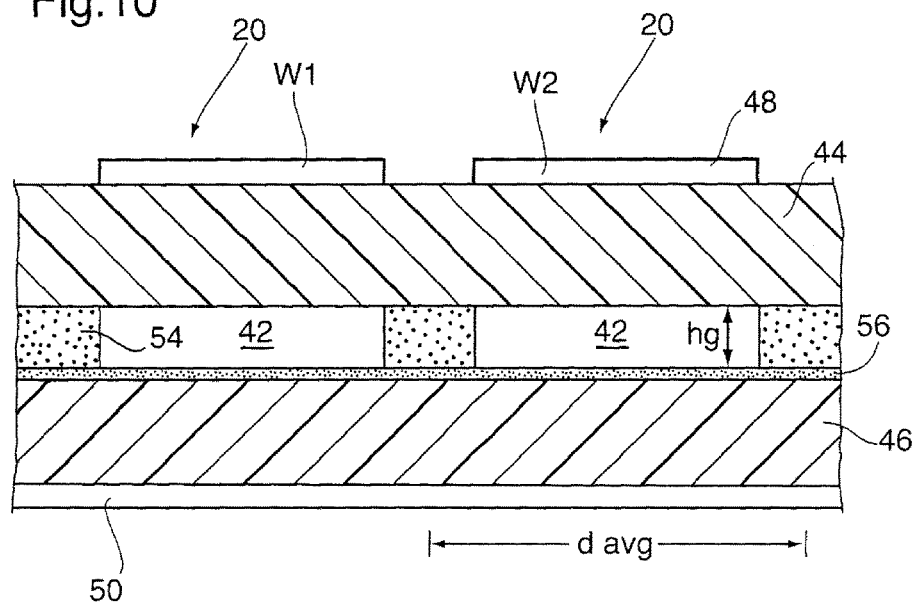
FIG. 10 illustrates schematically an enlarged partial cross-sectional view of transducer/sensors used in the CMUT microarray module shown in FIG. 7.

FIG. 7 shows an embodiment wherein each 40×40 microarray module 16 has a square construction of between about 1 and 3 mm in sidewidth and contains approximately 1600 transducers 20. As shown best in FIG. 7, the transducers 20 are arranged in a square matrix orientation of parallel rows and columns within each microarray module 16. The transducers 20 used in the module 16 of FIG. 7 are shown best in the cross-sectional view of FIG. 10 as having an average lateral width dimension $d_{avg}$ selected at between about 0.02 to 0.05 mm and more preferably about 0.03 mm. Each transducer 20 defines a respective rectangular air gap 42 (FIG. 10) which has a height $h_g$ of up to 3 nm and preferably between about 2.5 to 4 μm, and width in lateral direction selected at between about 0.01 and 0.03 mm. FIG. 10 further shows best the transducers 20 as having a simplified construction including a silicon bottom layer 46, and which is secured by way of a 0.5 to 20 μm thick layer 104 of Cyclotene™ or other suitable bisbenzocyclobutene (BCB) resin layer 54 to the upper silicon diaphragm membrane 44. In the array module 16 shown, the diaphragm membrane 44 has a thickness selected at between about 0.5 nm and 1.0 nm. FIG. 7 shows the gold conductive top layer 48 as being divided into individual, electrically isolated conductive gold wire strip bondings ($W_1$, $W_2$ ... $W_n$). The wire strip bondings $W_1$, $W_2$ ... $W_n$ extend across the diaphragm membranes 44 of aligned rows of transducers 20 and are each selectively electrically connected to the frequency generator 70 by way of a switching circuit 72.

In assembly, each 40×40 microarray module 16 is positioned as a discrete unit on the substantially flat substrate or backing layer 18. Within each individual 40×40 microarray module 16, the transducers 20 are grouped into parallel strips or columns $S_1$, $S_2$, ... $S_{40}$ (FIG. 7). The transducers 20 in each column $S_1$, $S_2$, ... $S_{40}$, are electrically connected to each other by an overlaying associated conductive gold wire bonding $W_1$, $W_2$, $W_3$ ... $W_{40}$. As shown in FIG. 7, the gold wire bondings $W_1$, $W_2$, $W_3$ ... $W_{40}$ are in turn selectively electrically coupled to the conventional frequency generator 70 by way of a switching circuit 72 and microprocessor controller 74. The frequency generator 70 is operable to selectively provide electrical signals or pulses at pre-selected frequencies. The applicant has appreciated that the activation of each individual or selected columns $S_1$, $S_2$ ... $S_{40}$ of transducers 20 within each microarray 16 may change in the output wavelength of the sensor assembly 14 by a factor of approximately 0.1 Å. By activating the switching circuit 72 to selectively switch power on and off to different combinations of columns $S_1$, $S_2$, ... $S_{40}$ of transducers 20 in each microarray module 16, it is possible to alter the signal shape of the transmitting signal wavelength output from the sensor assembly 14.

The generation of each electric pulse by the frequency generator 70 may thus be used to effect the physical displacement of the diaphragm membranes 44 of each transducer 20 within one or more selected columns $S_1$, $S_2$, ... $S_{40}$ electrically connected thereto, by the switching assembly 72, to produce a desired output ultrasonic wave frequency and/or profile having regard to the operation mode of the sensor assembly 14. The applicant has appreciated that in a most preferred configuration, signals are output from the sensor assembly 14 at wavelengths of between 110 kHz to 163 kHz, and preferably about 150 kHz. By the selective activation and deactivation of individual columns $S_1$, $S_2$ ... $S_{40}$ of transducers 20 in each microarray module 16, the output beamwidth and/or frequency, may be controlled depending upon the particular application requirement for the sensor system 12.

Figure 8A:
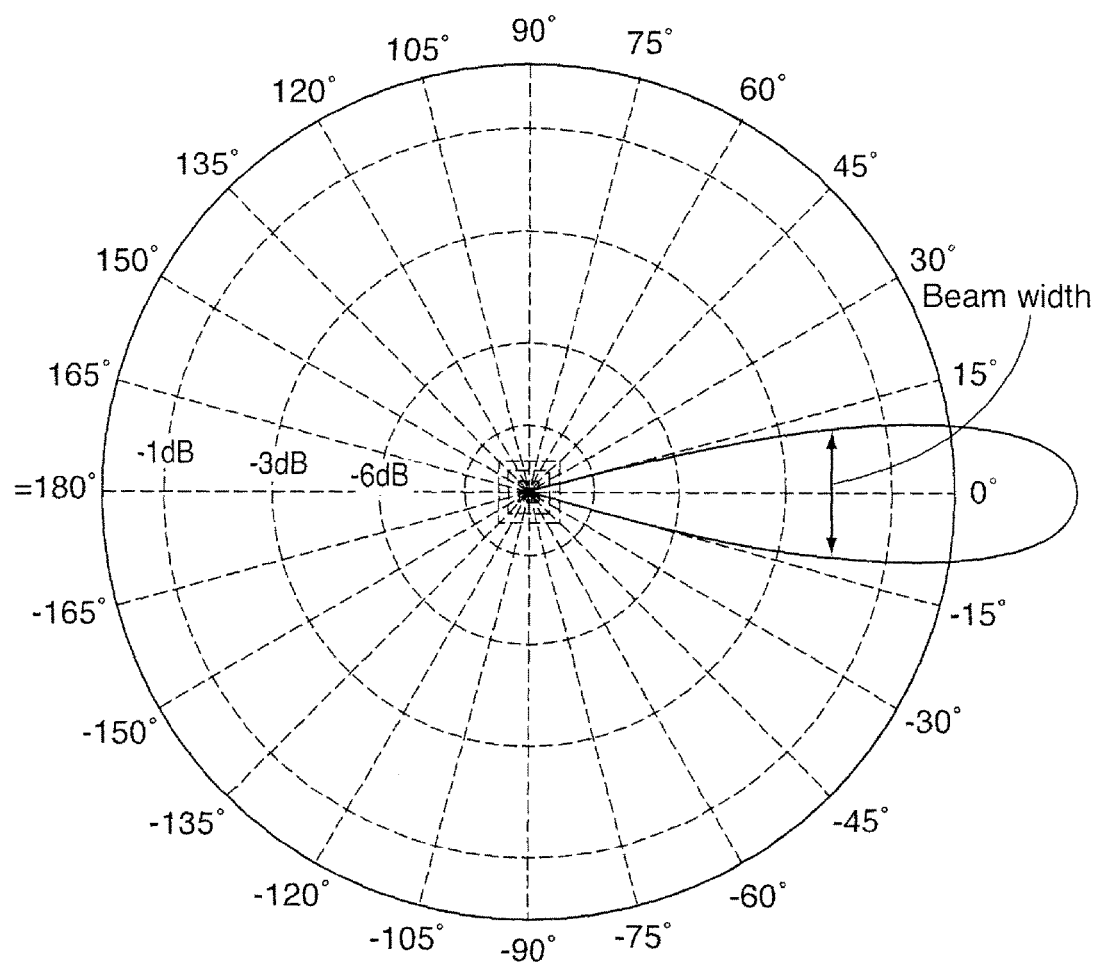
FIGS. 8a, 8b, and 8c illustrate polar plots of selected beam output geometries of output signals from the ultrasonic sensor assembly shown in FIG. 6.
Figure 8B:
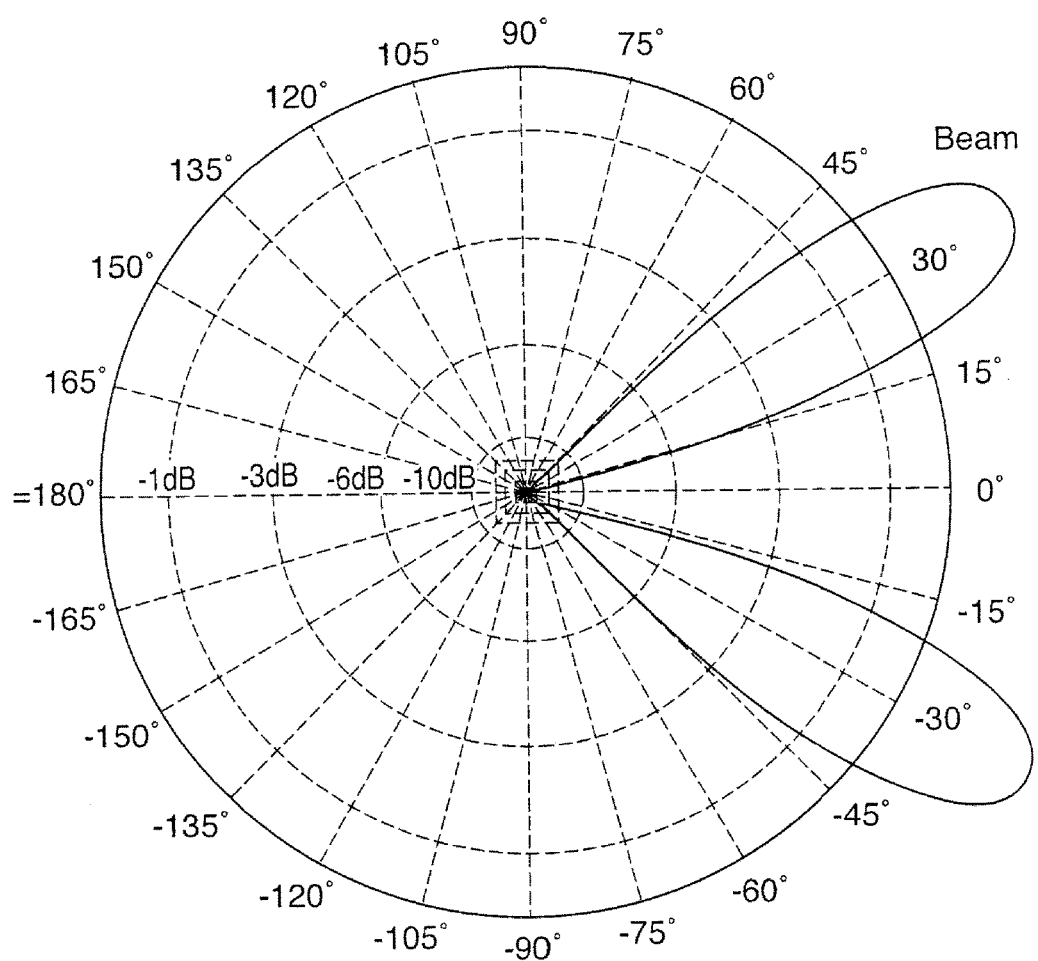
Figure 8C:
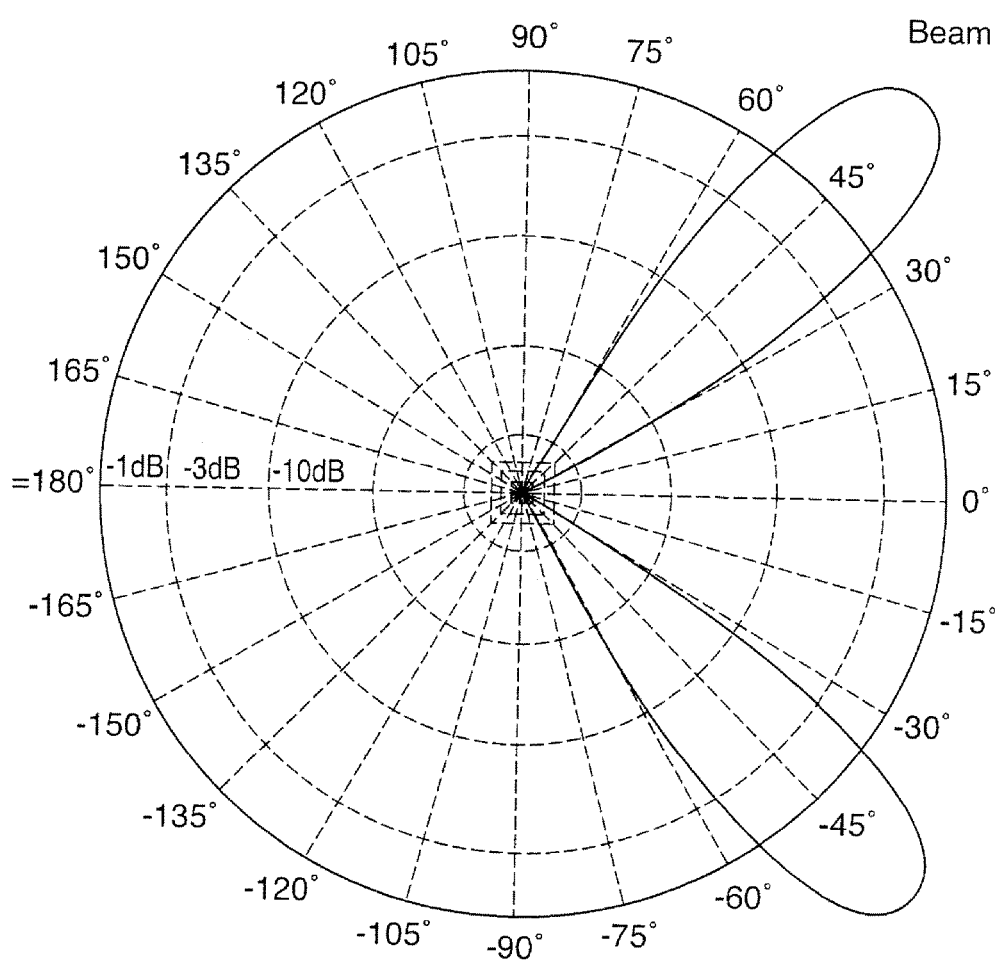

By example, FIGS. 8a to 8c show that depending upon the application requirements or mode of vehicle operation, it is possible to selective activate individual transducers 20 in each microarray module 16 to output a wider or even divergent beams, where for example, the sensor assembly 14 is used to provide warning signals in low speed back-up assist applications. In addition, different transducer 20 combinations in the same sensor assembly 14 may be activated to provide a narrower longer beamwidth, where for example, the vehicle is being driven at speed, and the sensor assembly 14 is operating to provide a blind-spot warning, as for example, during vehicle passing or lane change.

In a most preferred mode of operation, the controller 74 is used to control the switching circuit 72 to activate the same sequences of columns $S_1$, $S_2$ ... $S_{40}$ of transducers 20 within each of the CMUT microarray module 16 concurrently during operation of the sensor assembly 14. This advantageously may minimize any adverse nodal effects and/or signal interference between signals output by the individual CMUT microarray module 16 within the sensor. By way of example, FIG. 8a illustrates an output beam configuration, where the module 16 is operated with all of the switching assembly 72 switches closed. FIGS. 8b and 8c illustrate output beam geometries where, respectively, two switches and four switches of the assembly 72 at each opposing end are open.

In another mode of operation, the microprocessor controller 74 may be used to activate the switching circuit 72 to selective actuate the columns $S_1$, $S_2$ ... $S_{40}$ of transducers 20 in predetermined sequences to output signals of changing frequency. In yet another mode, the controller 74 may be used to activate the switching assembly 72 to initiate one or more individual columns $S_1$, $S_2$ ... $S_n$ of specific transducers 20 within only selected microarray modules 16 within the 5×5 array. In this regard, the signals output by the sensor assembly 14 may be coded or sequenced across a frequency range to more readily allow for the differentiation of third party sensor signals, minimizing the possibility of cross-sensor interference or false warning.

It is envisioned that the sensor assembly 14 shown in FIG. 7 thus advantageously allows for programmable beamwidths to be selected at 20 and 140° or more, by using the controller 74 and switching circuit 72 to change the sensor output wavelength dynamic. While FIG. 7 illustrates the transducers 20 within each CMUT microarray module 16 as being divided into forty separate columns $S_1$, $S_2$ ... $S_{40}$, it is to be appreciated that in alternate configuration the transducers 20 in each microarray 16 may be further grouped and/or alternately individually controlled. In one non-limiting example, the transducers 20 may be further grouped and electrically connected by row, with individual columns and/or rows within each CMUT microarray module 16 being selectively actuatable by the controller 74, switching circuit 72 and frequency generator 70.

FIG. 10 depicts a cross-sectional view of adjacent CMUT transducers 20 which measure approximately 30×30 micrometers in each lateral direction $d_{avg}$. In a more preferred construction, the completed CMUT microarray 16 will include 40×40 square matrix of 1600 CMUT transducers 20, and a have a dimensional width of between about 1.7 mm by 1.7 mm. In an alternate construction a 9×9 CMUT chip 36, may be provided with roughly 57600 individual CMUT transducers 20.

The sensor design provides for a CMUT microarray 16 (FIG. 6) having a square configuration, with the sensor chip 36 having a dimension of about 7 to 10 mm per side, and which is machined flat or substantially for marginally hyperbolic with the ±0.5° curvature. Preliminary testing indicates that the ultrasonic sensor assembly 14 is operable to transmit and receive signals through solid plastic bumper materials having thicknesses of upto several millimeters, and without the requirement to have currently existing "buttons" or collectors. As such, the sensor assembly 14 may advantageously be "installed behind the bumper" in automotive applications, using smooth surfaced bumper panels, creating a more aesthetically pleasing appearance.

In operation, in receive mode (shown schematically in FIG. 9) all or selected CMUT transducers 20 preferably are activated to receive and return beam signals to the output at the same time. The beam strength of the signals received, and/or the response time is thus used to determine obstruction proximity. In receive mode, the entirety of each CMUT microarray module 16 receives signals by impact which results in defection of the transducer diaphragm membranes 44 to generate receptor signals. The intensity and time of flight of the return signals detected by the degree of defection of each diaphragm membrane 44 provides an indication as to the proximity of an adjacent obstruction and/or vehicle.

Transducer Manufacture

In one process of manufacture, benzocyclobutene (BCB) is provided as the structural component and/or the adhesive used in the manufacture of each microarray module 16 in bonding to, or of silicon and silicon-on-insulator (SOI) wafers. In particular, in a first mode of manufacture, sheets of transducers are formed by bonding together preformed individual transducer halves 98,100 (FIG. 17) which are formed as sheets of wafers to simultaneously form multiple CMUT microarray modules 16, each having upto 1600 or more CMUT transducers 20. After bonding, the wafers are then cut into separate the individual modules 16 of desired sizes from the formed wafer sheet construct.

One simplified mode of manufacture of each 40×40 microarray module 16 is performed largely as a two-component manufacturing process. In manufacture, the microarray module 16 is prepared by joining an silicon wafer backing layer 80 (FIG. 11) to a second covering top wafer which functions as the device layer 84 (FIG. 16) using an etched BCB resin layer 54, and preferably Cyclotene, to provide the desired air gap 42 height $h_g$ or thickness in the Z-direction.

In one embodiment, the wafer backing layer 80 functions as the bottom layer 46 of each individual transducer 20. Likewise, the top layer or wafer 84, following trimming, functions as the displaceable diaphragm 44. In one preferred process described, the BCB resin layer 54, which optionally may be partially diluted with mesitylene, is applied to the silicon wafer backing layer 80, and then etched to form individual pockets 82 which, after assembly and joining of the preform halves 98,100 (FIG. 13, FIG. 16), form the individual transducer air gaps 42. It is to be appreciated that with the present process, in an alternate configuration, the BCB resin layer 54 could be applied to the top layer 84, with the microarray module 16 manufactured in an inverted fashion.

The formation of the lower preform half 98 is best described more fully with reference to FIGS. 11 to 15. As shown best in FIG. 11, the wafer backing layer 80 is secured to a removable silicon holder piece 120 (not shown to scale) by means of the layer of silicon dioxide 122, and with the silicon dioxide layer 122 is provided as a dissolvable adhesive which is coated on the silicon holder piece 120.

Figure 11:
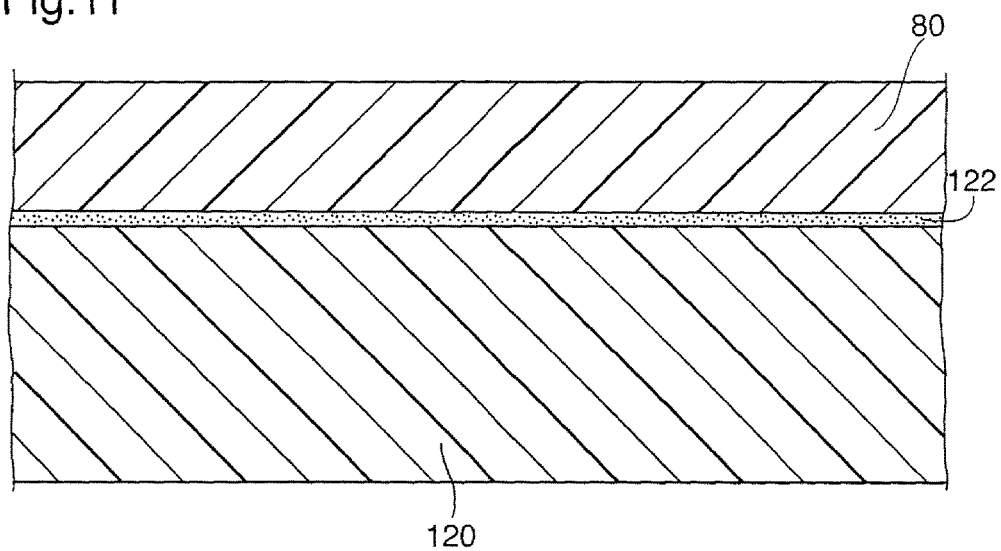
FIG. 11 shows schematically a silicon backing wafer coupled to a handling layer used in the formation of a transducer lower preform half, in accordance with a first mode of manufacture.
Figure 12:
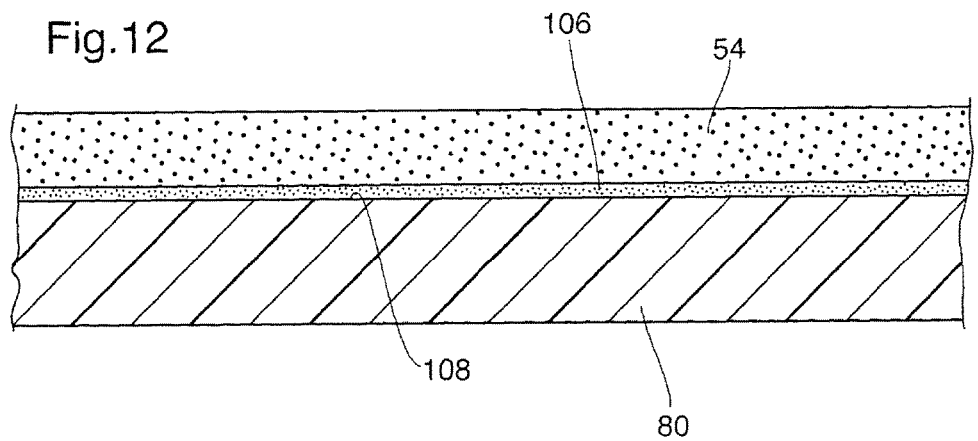
FIG. 12 illustrates schematically the initial application of a BCB structural layer on the bottom silicon backing wafer construct shown in FIG. 11.

As shown in FIG. 11, in the formation of the first preform half 98, a wafer backing layer 80, and removable silicon holder piece 120 are provided. A dissolvable adhesive 122, such as silicon dioxide, is coated on the silicon holder piece 120. The wafer 80 is then secured and mounted thereto and then sized. In a simplified construction, the wafer 80 is machined from the preform by grinding or laser ablation to a desired final thickness.

While the layer 80 is preferably machined or laser etched to a desired thickness, in alternate construction, the layer could be spin formed from or other suitable materials or resins.

Figure 13:
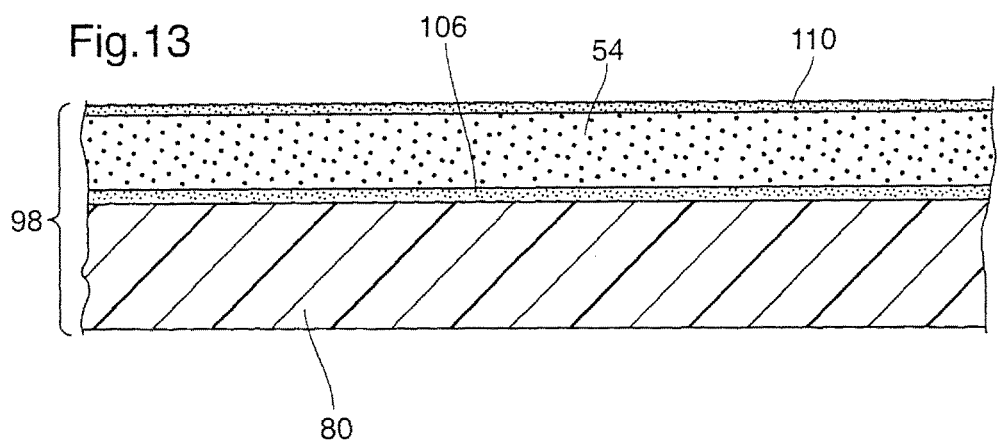
FIG. 13 illustrates schematically the application of a top photoresist layer on the applied BCB structural layer illustrated in FIG. 12.
Figure 14:
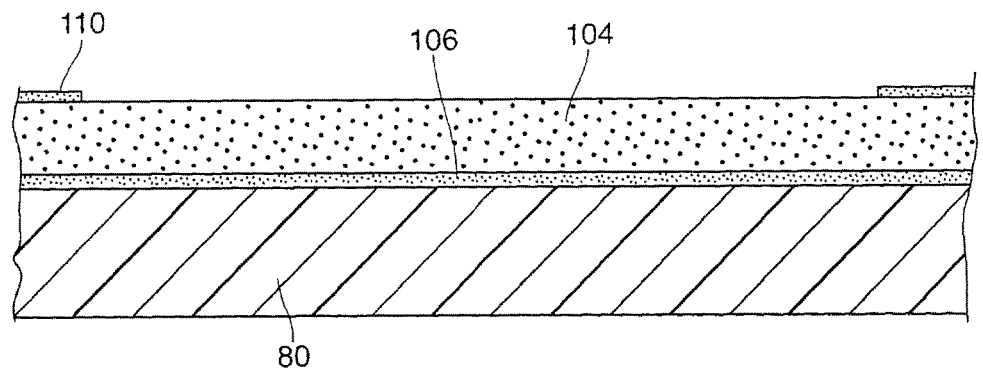
FIG. 14 illustrates schematically the partial removal of the photoresist layer shown in FIG. 13 prior to BCB layer etching.

Although not essential, the silicon holder layer 120 (omitted from FIGS. 12 to 14 for clarity) allows for easier handling of the wafer backing layer 80, together with its final sizing to provide each transducer 20 with a bottom layer 46 having the desired thickness. In preferred construction, the silicon backing wafer 80 is provided with a thickness is the Z-direction selected at between about 0.1 to 1 mm. Thinner or thicker wafers may, however, be used. Preferably, a 4-inch N type silicon wafer 80 is provided as the backing layer wafer (FIG. 14). The silicon wafer 80 is heavily doped with Antimony to achieve resistance in the range of 0.008 to 0.02 $\Omega \cdot cm^2$.

An adhesion promoter layer 106 (FIG. 12) such as AP3000™ is next applied to the top surface 108 of the silicon backing wafer 80. To prepare the surface for BCB coating, the adhesion promoter layer 106 is applied to the top surface 108 of the silicon wafer 80 (FIG. 14) and then spun dry. The resulting layer surface 106 is then immediately ready for BCB coating to form the structural layer 54. Following the application of the adhesion promoter layer 106, the BCB layer 54 is applied and then cured preferably to between about 30% to 70% of a fully cured state. Most preferably, the BCB layer 54 is selected as Cyclotene™ resin which is provided with a thickness in the Z-axis direction of upto 30 microns, and most preferably at between about 0.1 to 5 microns. The BCB layer 54 provides various advantages. In particular, the use of the BCB layer 54 acts as an electrically insulating (non-conductive) structural layer. In addition, the applicant has appreciated that the BCB layer 54 advantageously allows for some deformation, enabling a more forgiving fit with both the silicon backing wafer 80 and the wafer 84 in final assembly. This in turn advantageously allows for higher production yields with more consistent results.

In an alternate manufacture, the BCB layer 54 may be fully cured, particularly where further adhesive layers and/or adhesion promoter layers (i.e. AP3000) are to be subsequently applied thereto. Most preferably, however, the BCB layer 54 is cured to about a 50% fully cured state, by heating for approximately one-half the rated time required to achieve full curing, having regard to the Z-direction layer thickness. Following the desired curing of the BCB layer 54, the preform half 98 is masked using a photoresist coating 110 (FIG. 13). Following BCB coating, a 0.5 micrometer thickness Shipley 1805 photoresist layer 110 (FIG. 15) is spin deposited on top of the BCB structural layer 54. After soft baking of the photoresist at 150° C., the photoresist layer 110 is exposed to UV light to effect photolithography and remove the desired parts of the layer 110 with the location and geometry of the where pockets 82 to be formed, exposing the underlying BCB layer 54. The mask coating 110 is applied to pattern the BCB layer 54 with the desired air pocket 82 (FIG. 15) configuration to achieve the intended size and orientation of the resulting transducer air gap arrays 42.

After exposure and activation, the non-activated remnant portions of the portions of the mask coating 110 are removed (FIG. 14) to expose the selected air pocket configuration and BCB layer 54 for photo plasma etching. Preferably, BCB layer 54 is then dry etched using $CF_4/O_2$ in an ICP (Inductively Coupled Plasma) reactor to form the pockets 82 in the pattern and orientation of the desired transducer air gap 42 configuration to be included in the microarray module 16.

Figure 15:
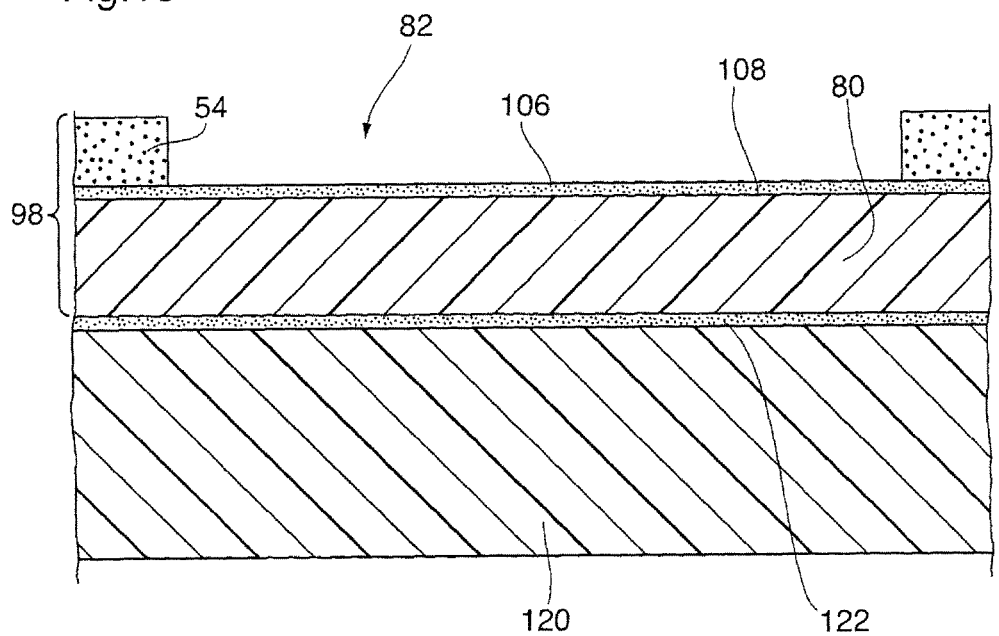
FIG. 15 illustrates schematically the partial etching of the BCB layer shown in FIG. 14, and the subsequent application of an adhesive promoter layer.

The preform half 98 is then subsequently etched to form the individual pocket recess 82 (shown in FIG. 15). Again, the pockets 82 are formed with a size and desired spacing to function as the air gap 42 of each transducer. Most preferably, the pockets 82 are preferably formed with a width of about 0.03 mm in each lateral direction, and to a depth of 2.5 to 5 microns.

Although not essential, preferably each pocket 82 further extends through the BCB layer 54 to at least the underlying adhesion promoter layer 106. Optionally, etching may be performed to remove the underlying portion of the adhesion of the promoter layer 106, exposing the silicon backing wafer 80 at the bottom of each pocket 82.

The pockets 82 may be manufactured having a square shape to maximize their number and placement on the silicon backing wafer 80. Other embodiments could however include circular shaped pockets or recesses, resulting in a large ship and/or pockets of a polygonal and/or hexagonal shape. The formation of the pockets 82 in a square matrix orientation allows for simplified transducer switching, however, other configurations are also possible.

Following etching, the preform 98 is cleaned to remove any remaining mask coating 110, exposing the BCB layer 54.

Figure 16:
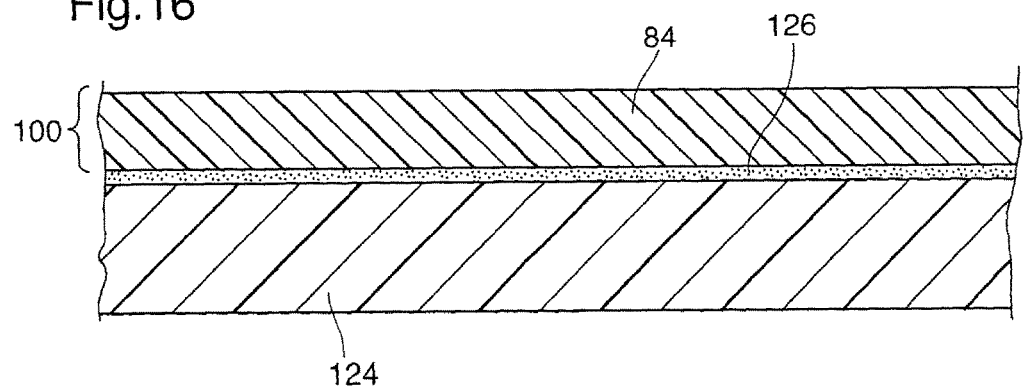
FIG. 16 illustrates schematically the formation of a silicon wafer upper preform half for use in forming a transducer membrane diaphragm in accordance with a first method of manufacture.
Figure 17:
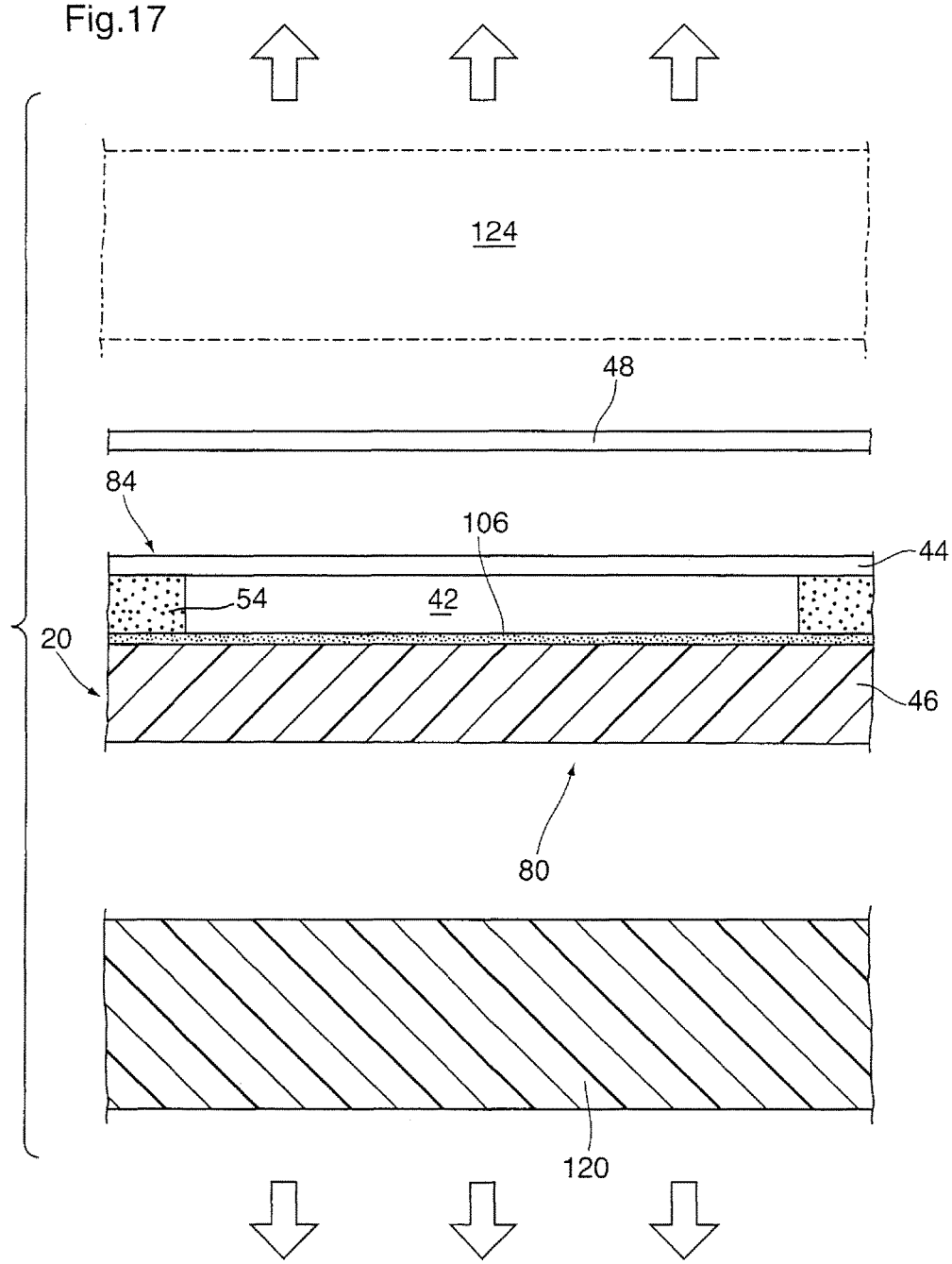
FIG. 17 illustrates a partially exploded view illustrating the placement of the upper preform half on the lower preform half in final assembly of the transducer, in accordance with a first preferred method.

FIGS. 16 and 17 show best the formation of the upper preform half 100, and its positioning over the lower preform 98. FIG. 17 illustrates the top silicon wafer 84 as being provided as part of a SOI silicon covering wafer, wherein the wafer 84 is releasably secured to a holder layer 124 for simplified manufacture. The holder layer 124 may be selected from a further silicon layer which is used to mount the silicon wafer 84 by a dissolvable silicon oxide layer 126 or other suitable solvent. Alternately, the holder layer 124 could be formed as a BCB layer which is adhered to the silicon wafer 84 by 1 nm thick AP3000 layer. Again, in one simplified construction, the top silicon layer 84 is machined from a wafer by grinding or laser ablation to a desired thickness, having regard to the intended thickness of the membrane 44.

The final thickness of the wafer 84 is chosen to provide a membrane 44 (FIG. 17) which has the desired finished thickness, and which is most preferably is chosen at between about 0.1 to 50 nanometers. The final thickness of the silicon wafer layer 84 furthermore is selected having regard to the frequency range (thinner=lower frequency) of the beam output signal to be provided by the microarray module 16.

In a simplified construction, the wafer layer 84 is provided for mounting directed to the partially cured BCB layer 54. The top silicon layer 84 may, however, be optionally coated with an adhesion promoter layer (not shown) to facilitated bonding with the partially cured BCB layer 54.

As shown in FIG. 17, the preforms 98,100 are aligned and the layer 84 is brought into contact against the BCB structural layer 54. On moving the top silicon layer 84 into alignment and contact against the BCB layer 54, the preforms 98,100 are then heated to fully cure the BCB layer 54 and effect the final bonding and fusing of the silicon layer 84/BCB layer 54, sealing the transducer air gap 42.

Most preferably following positioning of the silicon wafer 84 over the lower preform half 98, the preform halves 98,100 construct are heated to an initial bonding temperature of about 150° C., to drive out residual solvents and effect maximum bonding strength. The bonded halves 98,100 are then final cured at 250° C. in a nitrogen atmosphere for about one hour.

Following the mounting of the upper preform half 100 over the lower preform half 98, the silicon dioxide adhesive layer 126 is dissolved and the holder layer 124 is removed. Thereafter, the top silicon layer 84 may be laser ablated to the desired finish thickness to achieve the membrane diaphragm 44 (FIG. 17), and preferably to a thickness of between 0.1 to 5 nm, and which has flat uppermost surface. After laser ablating, a chromium interface layer and the conductive gold layer 48 is optionally photoplated onto the top surface of the silicon layer 84. Following plating, the adhesive layer 122 is next dissolved and holder piece 120 removed. The holder layers 120,124 may be removed by selectively dissolving the adhesive layers 122,126 using $CF^4/H^2$, leaving the top silicon wafer 84 in place as the displaceable membrane 44.

In one method, the conductive layer 48 is provided as a 100 nm thick gold layer which is deposited over the top of the membrane wafer 84. In an alternate construction, the gold layer which is spin deposited in place to achieve a desired top layer thickness.

Optionally, the fused wafer assembly is thereafter cut to a desired module 16 size having a desired number of individual transducers 20 (i.e. a 40×40 array). The conductive gold layer 48 provides electric conductivity from the frequency generator 70 to the metal deposit layer 50 formed on the sensor backing platform 18.

Where the sensor assembly 14 is to be provided with individually actuatable columns of transducers 20 $S_1$, $S_2$ ... $S_{40}$ (as for example is shown in FIG. 7), after photo-printing of the gold layer 48, the layer 48 is thereafter selectively etched to remove and electrically isolate the portions of the layer, leaving behind the conductive gold wire bondings $W_1$, $W_2$ ... $W_{40}$, which provide the electrical conductivity to the associated columns of transducers $S_1$, $S_2$ ... $S_{40}$. In one embodiment, the completed CMUT microarray 16 is thereafter ready for direct robotic mounting on the coated metal surface 50 of the backing platform 18 by the use of an electrically conductive adhesive Yet another mode of transducer manufacture is described with reference to FIGS. 18 to 28 wherein like reference numerals are used to identify like components. The method is performed as step-by-step fabrication process used to join a silicon backing wafer 80 as the backing layer 46 and a BCB top wafer 144 (FIG. 26), in place of a silicon wafer 84, as the top device layer or transducer membrane 44.

FIGS. 18 to 23 illustrate the formation of the lower preform half 98 (FIG. 23) of each transducer 20. The preform half 98 is manufactured using a silicon backing layer 80 formed in substantially in the manner in accordance with the embodiment described with reference to FIG. 11. In forming the lower preform half 98, a standard N-type silicon wafer 80 is used, and which has been heavily doped with antimony to achieve a resistance of between about 0.008 and 0.02 ohm per square centimeter. Optionally, for ease of handling the wafer 80 may be secured to a silicon holder 120 by a dissolvable silicon oxide layer 122 in the manner shown in FIG. 11. Alternately, the holder layer could be formed as a BCB layer which is adhered to the silicon wafer 80 by 1 nm thick AP3000 layer. Preferred BCB used in the layer 118 would include Cyclotene™ 3022-35, and which optionally is diluted by mesitylene.

Figure 18:
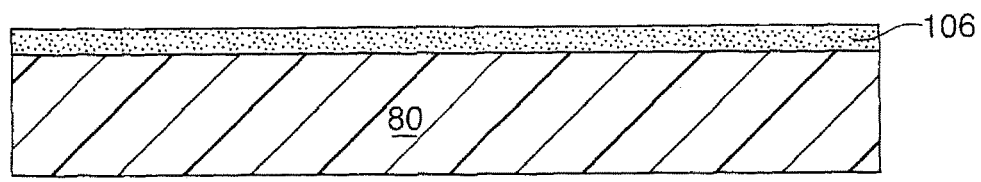
FIG. 18 illustrates schematically the initial application of an adhesion promoter layer on a silicon wafer used in the formation of a lower preform half, in accordance with an alternate method.

The upper surface 108 of the silicon wafer 80 is coated with approximately a one nanometer thick layer of adhesion promoter 106, and preferably AP3000™, as shown in FIG. 18.

Figure 19:
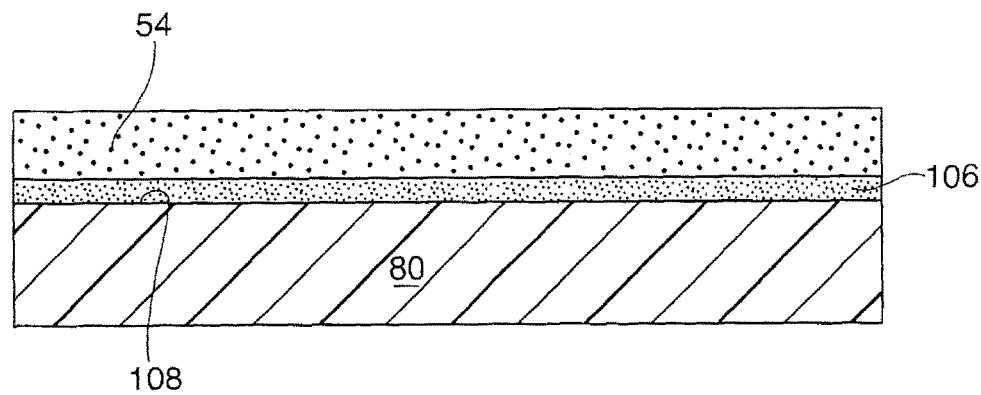
FIG. 19 illustrates schematically the application of a BCB structural on the adhesion promoter layer shown in FIG. 18.
Figure 20:
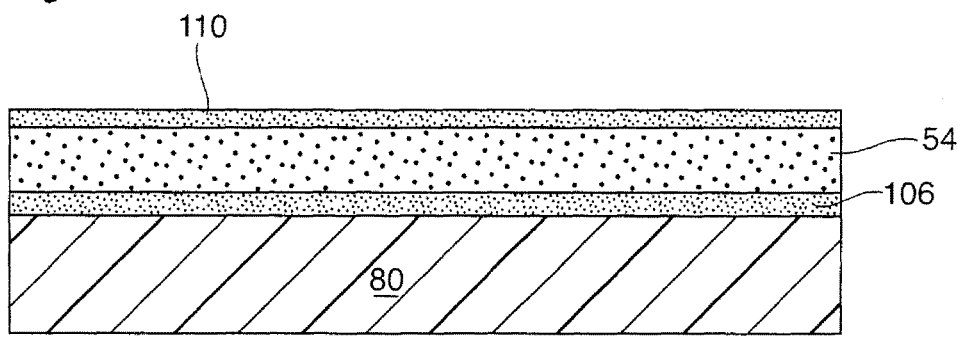
FIG. 20 illustrates schematically the application of a top photoresist layer on the applied BCB structural layer illustrated in FIG. 19.

Following coating with the adhesion promoter layer 106, a next structural layer of BCB 54 (FIG. 19) is applied over the adhesion promoter layer 106. The BCB layer 54 may be partially thinned with a suitable thinner, and is spin deposited over the adhesion promoter layer 106 to provide a substantially smooth parallel surface and achieve the desired Z-height for each the transducer 20 air gap 42. Most preferably, BCB structural layer 54 is spin deposited to provide a predetermined thickness of between about 500 and 1500 nanometers, and most preferably about 900 nanometers. Following spin deposition, the coated wafer backing layer 80 is placed in an oven and heated at approximately 300° C. for approximately half the rated time required to achieve full curing of the BCB layer 54. The BCB layer 54 is thus heated to effect its partial, and preferably about 40% to 60% of full curing, so as to effect the stabilizing the BCB layer 54 as partial gel layer (FIG. 19).

Figure 21:
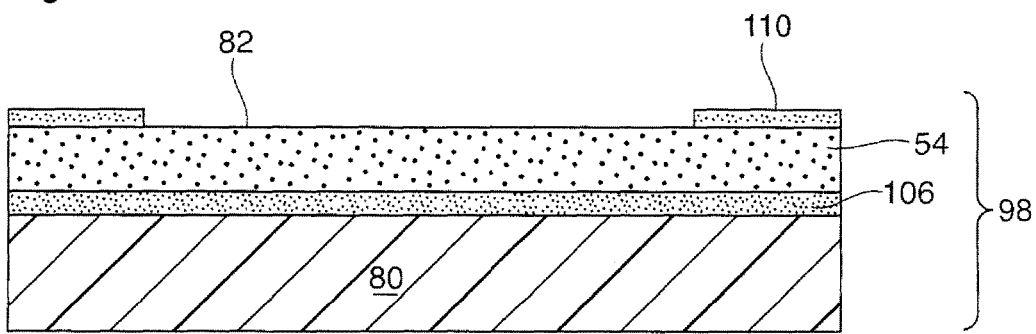
FIG. 21 illustrates schematically the partial removal of the photoresist layer shown in FIG. 20 prior to etching of the BCB layer.

Following partial curing, the next photoresist layer 110 is deposited on to the upper surface of the gel BCB structural layer 54. Most preferably, the photoresist layer 110 is selected as an 1805 photoresist layer, which is applied with a thickness of about 0.5 micrometers. The photoresist layer 110 (FIG. 20) is deposited evenly onto layer 54 and then exposed to UV light through a photo negative mask that prints the transducer pockets onto the photo-resist. The exposed photo-resist is chemically changed and resists being washed away where the unexposed material is easily washed away exposing layer 54 as shown in FIG. 21.

Figure 22:
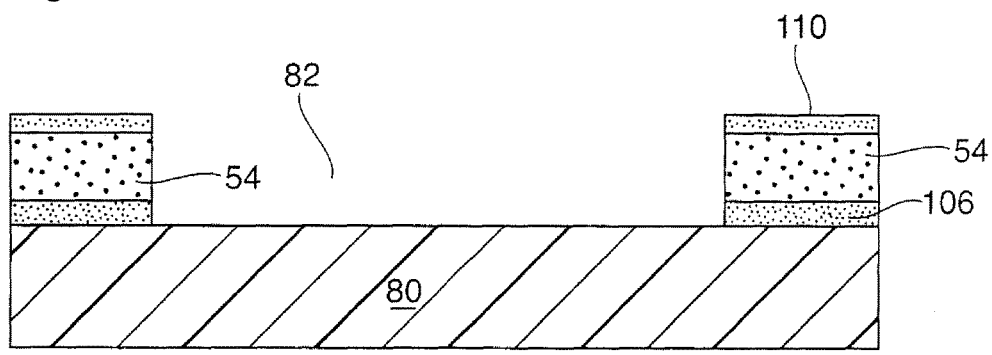
FIG. 22 illustrates schematically the lower preform half following pocket etching to remove exposed BCB and optionally adhesion promoter layer.

The wafer is then placed into an etching bath where the exposed BCB in layer 54 is etched. Etching removes exposed regions of the gel BCB structural layer 54 which remain unprotected, and form individual pockets 82 (FIG. 22). Etching is preferably performed for a sufficient period of time, such that the pockets 82 remove the portions of both the exposed areas of the gel BCB layer 54, as well as the underlying adhesion promoter layer 106 (FIG. 22). The pockets 82 are formed with a size and desired spacing to function as the air gap 42 of each transducer 20. As with the previously described method, the pockets 82 are preferably formed with a width of about 0.03 mm in each lateral direction, and to a depth of about 2.5 to 4 μm. Although square shaped pockets 82 are preferred to maximize their number of placement space on the backing wafer 80, other shapes and orientations may be used.

Etching is not preferably performed such that that at the bottom of each pocket 82, the silicon backing layer 80 is exposed as a substantially flat surface, and preferably has a thickness selected less than about 0.5 mm.

Figure 23:
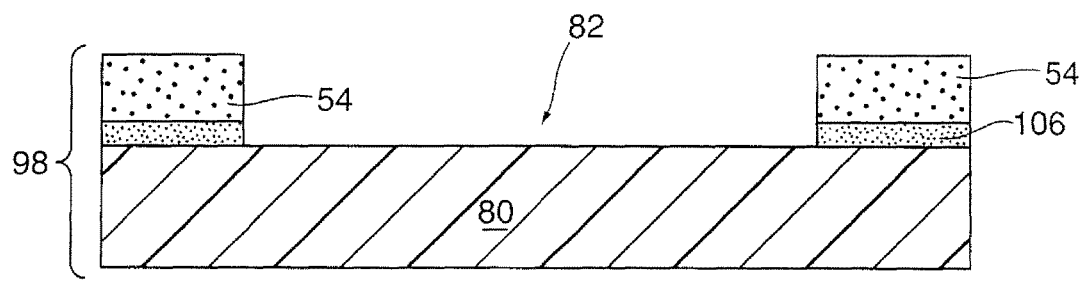
FIG. 23 illustrates schematically the lower preform half shown in FIG. 22 following removal of remnant photoresist layer.

Following etching, the preform half 98 is washed in suitable solvents whereby remnants of the photoresist layer 110 are removed, exposing the partially cured gel BCB layer 54 (FIG. 23). The preform half 98 is than washed and cleaned prior to final assembly with a selected upper preform half 100.

Figure 24:
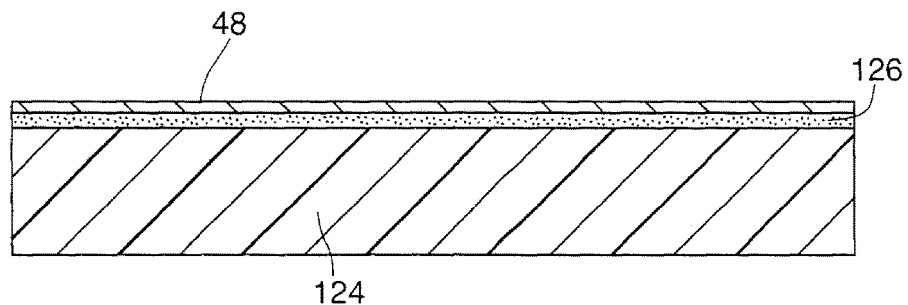
FIG. 24 illustrates schematically the application of an initial conductive gold deposit layer on a silicon holding fixture in the formation of an upper preform half, used in the manufacture of a transducer in accordance with an alternate embodiment.

In an alternate method of forming the top preform half 100 and transducer diaphragm 44, a silicon oxide handling wafer 124 is provided as shown in FIG. 24. The silicon oxide release layer 126 is then sputtered with gold to form the top gold layer 48 as shown in FIG. 24. The deposition of the gold layer 48 is alternately effected by conventional plating processes, to achieve a gold layer 48 which is substantially flat, and deposited in the final desired thickness.

Figure 25:
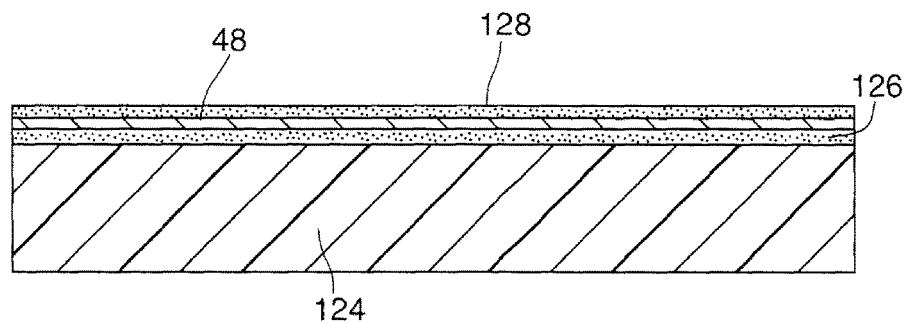
FIG. 25 illustrates schematically the application of an adhesion promoter layer on the conductive layer formed in FIG. 23.
Figure 26:
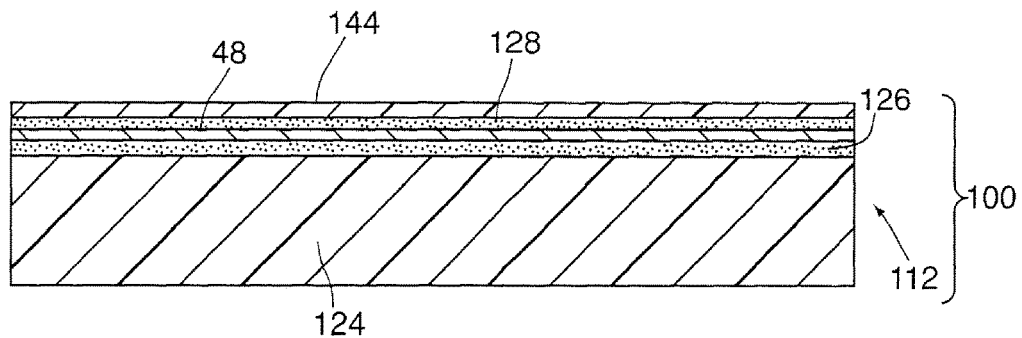
FIG. 26 illustrates schematically the formation of a BCB diaphragm on the adhesive promoter layer shown in FIG. 25.

As shown in FIG. 25, following gold plating, an adhesion promoter layer 128, such as AP3000™, is applied over the gold layer 48. Most preferably, the adhesion promoter layer 128 is provided with a substantially even thickness selected at between about 0.2 to 5 nm, and preferably at about 0.5 nm.

Following deposition of the adhesion promoter layer 128, a BCB layer 144 is then spin coated onto the top of the adhesion promoter layer 128. The BCB layer 144 is applied with a thickness chosen to form the diaphragm 44. It is to be appreciated, that the spin coating application of the BCB layer 144 allows for the even formation of the BCB layer 144 to predetermined thickness. The BCB lay may, for example, be formed from Cyclotene which may or may not be thinned to achieve a desired viscosity for spin coating. Most preferably, the BCB layer 144 is provided with a wet thickness which is selected to compensate for the anticipated shrinkage expected during final curing, and which will provide a diaphragm 44 with a final thickness of less than about 50 nm and preferably between about 0.2 and 0.8 nm, depending on the sensor application. Thicker or thinner diaphragms 44 may, however, be formed.

Figure 27:
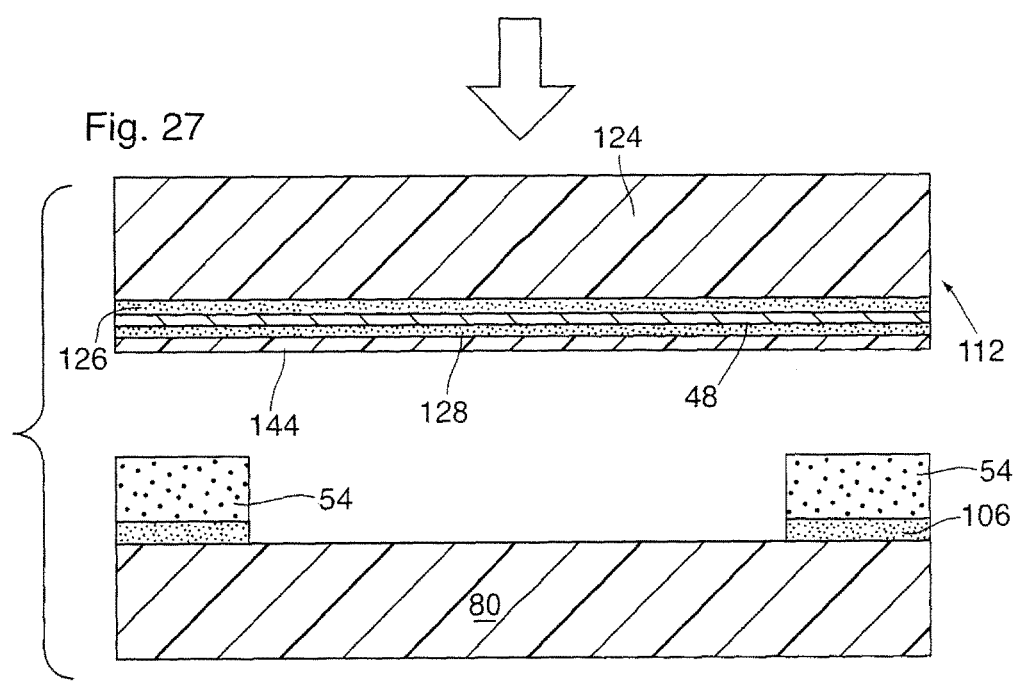
FIG. 27 illustrates schematically the assembly of upper and lower preform halves in the manufacture of a transducer in accordance with the further method.
Figure 28:
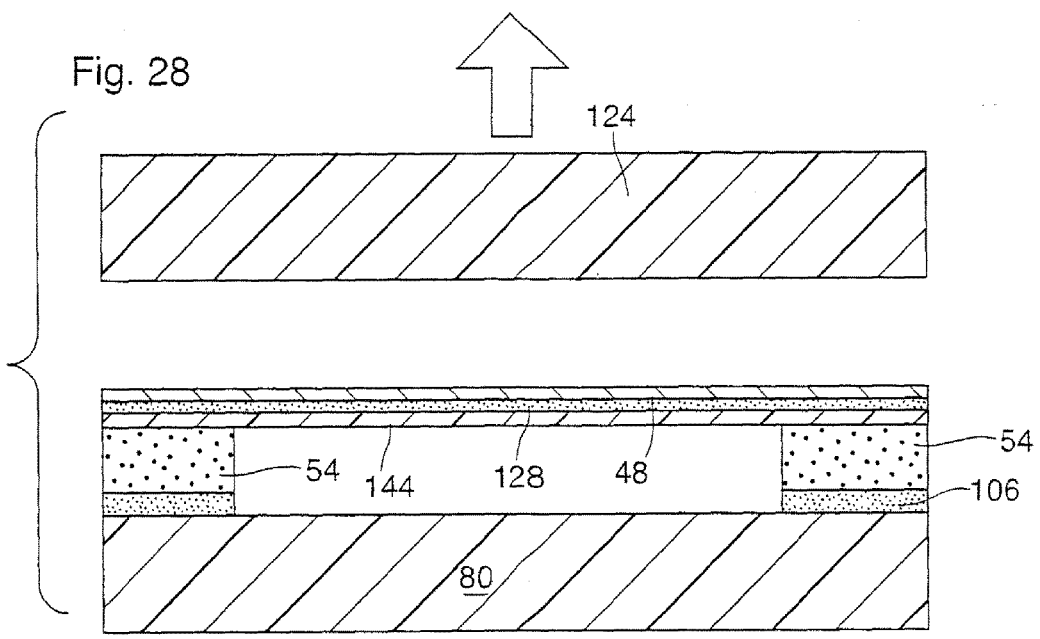
FIG. 28 shows schematically a transducer/sensor manufactured in accordance with the alternate method.

FIGS. 27 and 28 show best the assembly of the BCB based upper preform 100 to the BCB layer 54 of the lower preform 98. With the BCB layer 144 remaining in a wet, substantially uncured state, and the BCB layer 54 remaining only approximately 50% cured, the two preform halves 98,100 of the transducer 20 are moved into alignment (FIG. 27) and placed into a vacuum oven (not shown).

The oven is brought to a full vacuum prior to contact prior to effecting contact between the preform halves 98,100. Following vacuum conditions, the wet BCB layer 144 and partially cured BCB layer 54 are brought into registry, the halves 98,100 are held together under a mild pressure of approximately 3 foot pounds, and heat cured at 300° C. for a sufficient time to effect the full curing of both BCB layers 144,54. It is to be appreciated, that during full curing, the wet BCB layer 144 will contract and shrink. Shrinkage is a known value provided by the manufacturer and dependent of the select grade of BCB to be used, and may be as high as 10% by volume.

Following final curing, the bonded preforms 98,100 of assembled wafers are removed from the vacuum oven and are cooled. The assembly is then placed into a buffered oxide etch (BOE) bath to selectively remove the silicon oxide adhesive layer 126 and handling wafer 124 (and if applicable, an adhesive layer 122 and backing wafer holder 120 for the silicon wafer 80). The removal of the silicon oxide layer 126 and release of the handling layer 124, exposes the top gold layer 48 which is bonded to the diaphragm 44, and provides a conductive front face 38 of the formed transducer 20.

While the preferred embodiments describe the formation of conductive ground layer 50 on the back surface 22 of each transducer 20 (FIG. 10), the invention is not so limited. In an alternate construction, the top conductive layer 48 may be provided to electrically connect the microarray 16 with the sensor assembly 14 ground.

Figure 29:
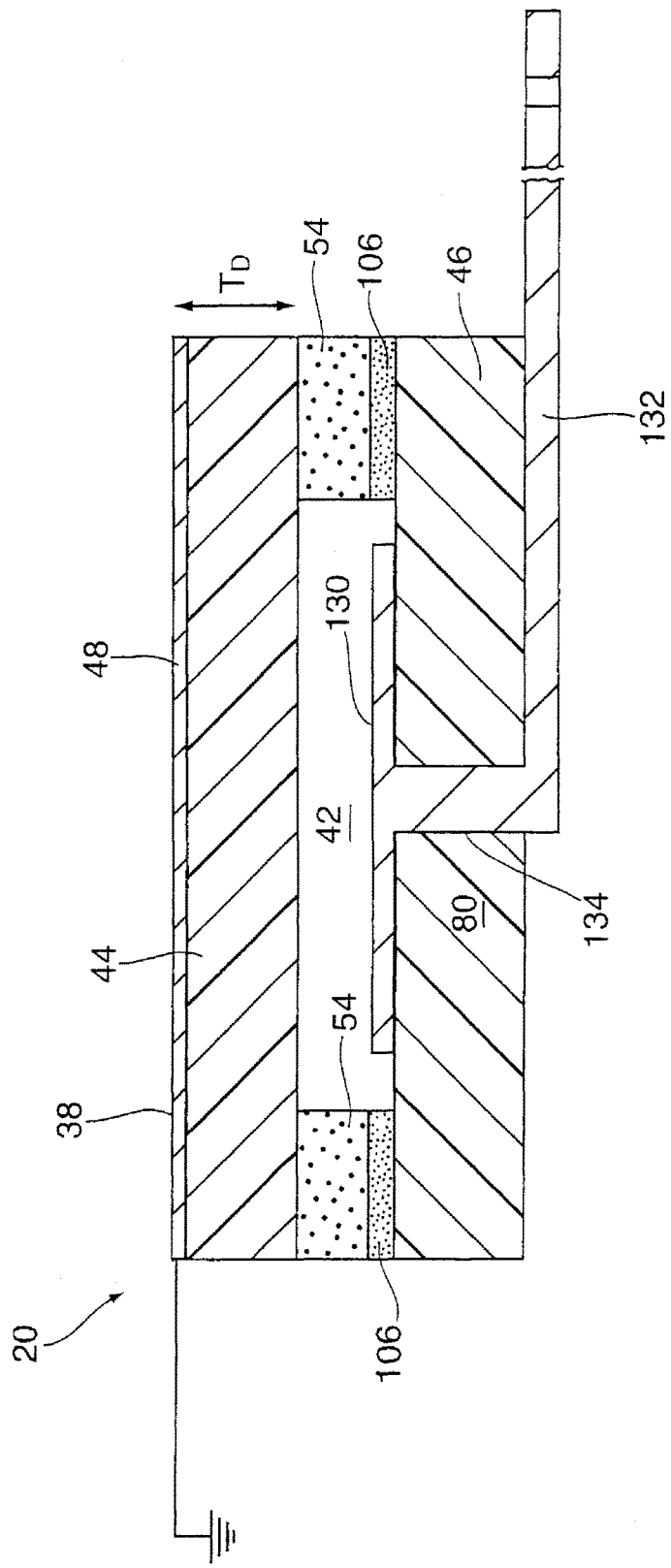
FIG. 29 illustrates schematically a transducer sensor in accordance with a further embodiment of the invention.

Reference may be had to FIG. 29 which illustrates a transducer 20 in accordance with a further embodiment of the invention, and in which like reference numerals are used to identify like components. In the transducer 20 of FIG. 29, a conductive gold pad 130 is provided within the transducer air gap 42 on the upper surface of the silicon bottom layer 46. The conductive pad 130 is preferably formed of gold, copper, silver or other electrically conductive metal, and is electrically coupled to the frequency generator 70 (FIG. 9) by way of conductive lead 132 which extends from a rear surface of the conductive pad 130, through an aperture or via 134 formed through the silicon backing 46.

Figure 30:
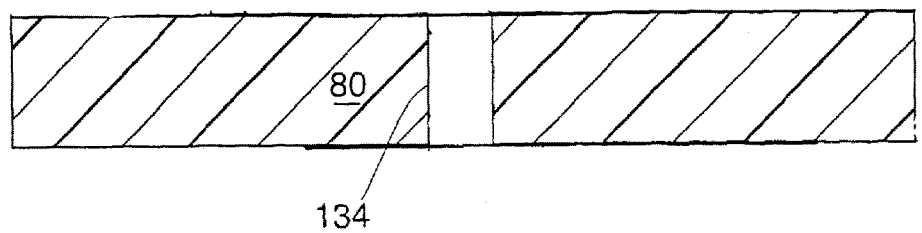
FIG. 30 shows the formation of vias in a silicon wafer to manufacture the lower preform in according with a further embodiment.
Figure 31:
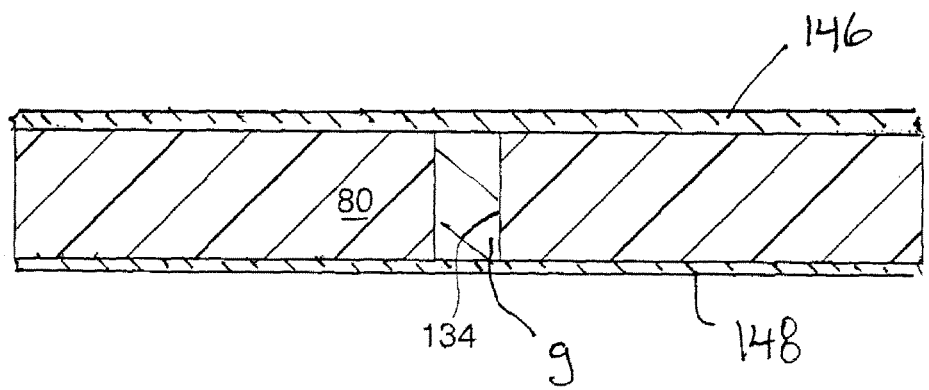
FIG. 31 shows the application of photo-resist layers on the silicon wafer of FIG. 30, following gold infilling of vias.
Figure 32:
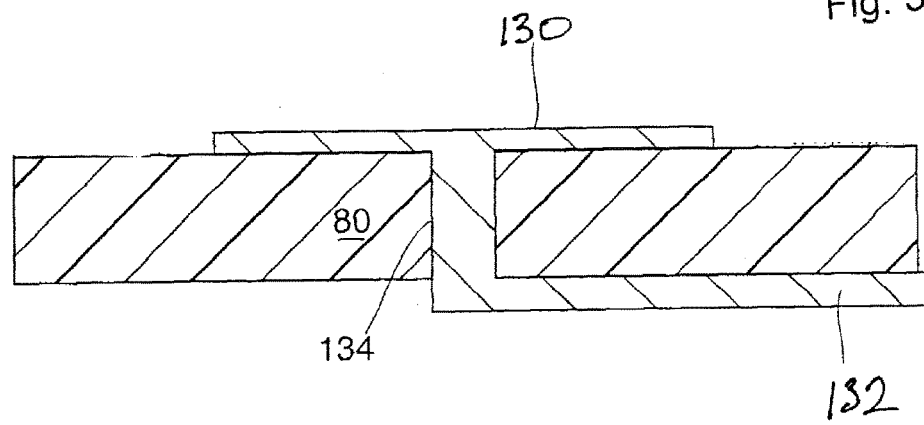
FIG. 32 shows the formation of conductive gold pads and inductive leads on the silicon wafer of FIG. 31, following photoresist layer activation, gold deposition and washing.

As shown in FIGS. 30 to 33, in a preferred method of manufacture, the silicon backing layer 80 is initially selected substantially in accordance with the embodiment described with reference to FIG. 11. Following its formation, vias 134 are machined through the backing layer 80 at a center region of each intended transducer air gap 42 location, as shown in FIG. 30.

Following formation of the bias 134, the via holes are infilled with gold (g), or other selected conductive metal. The forward and rear surfaces of the backing layer 80 are then coated with suitable photo-mask layers 144, 146 which are patterned to respectively form the desired conductive pads 130 and conductive leads 132 (FIG. 28). The masked backing layer 80 is then exposed to activate the mask layer and washed to remove portions of the mask layer where the pad and conducted lead platings are to be formed.

The front and back surfaces of the layer 80 are then plated with a desired thickness of gold (or other conductive metal) using electroless deposition or sputtering techniques, and then washed to remove excess gold deposits, leaving the plated conductive pad 130 and conductive lead 132 structures.

Following washing and final cleaning and drying, the adhesion promoter layer 106 and BCB structural layer 54 are then formed on the metal plated wafer 80 to form the preform half 98 in the manner described with reference to FIGS. 19 to 23, and whereby pocket etching 82 in undertaken to expose each gold conductive pad 130. The preform half 98 is then preferably joined with an upper preform half 100 in accordance with the previously described embodiments.

Figure 33:
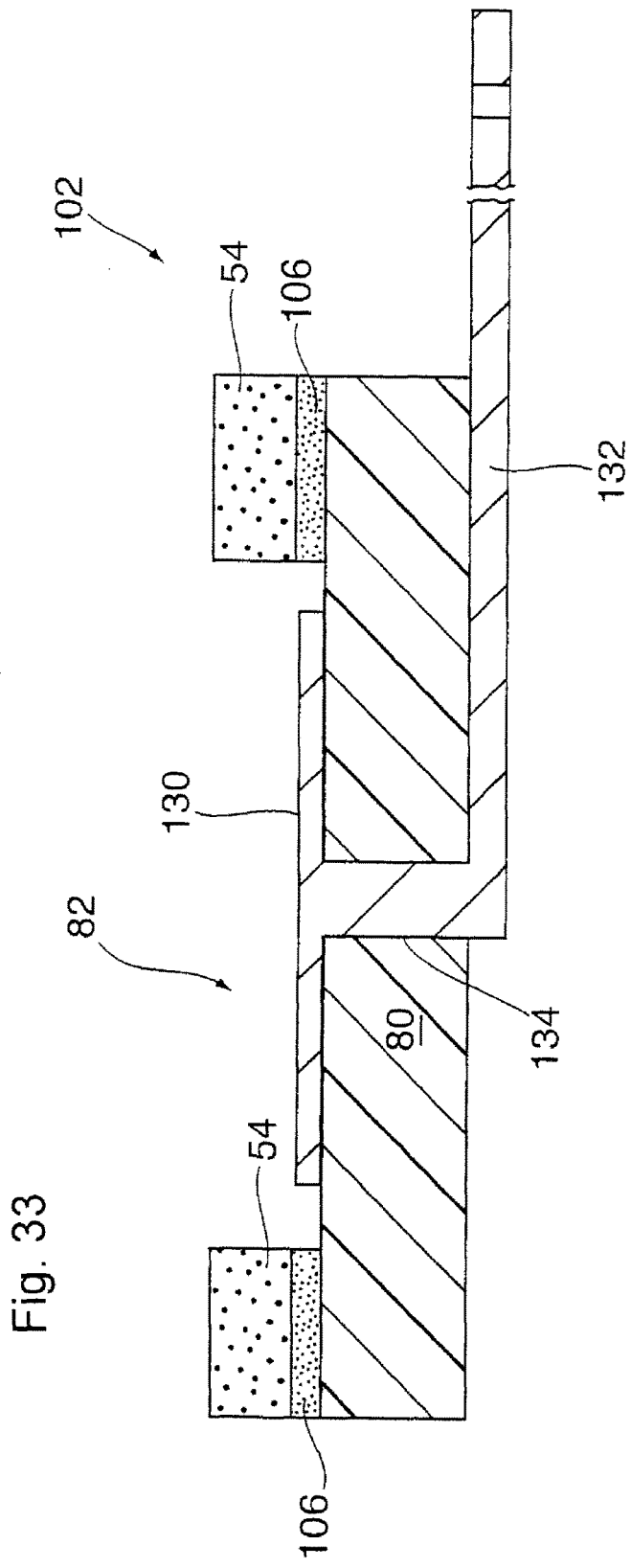
FIG. 33 illustrates schematically the formation of a conductive gold pad on a lower preform in accordance with a further embodiment.

FIG. 33 illustrates the preform half 102 of the transducer 20 formed in accordance with the further embodiment, and wherein reference numerals are used to identify like components. Following etching of the BCB layer 54, and removal of the photoresist layer 110 for example shown in FIG. 21 to expose the bottom wafer 80 and conductive pad 130.

Preferably, the conductive pads 130 are formed as a conductor plate having a thickness in the Z-axis dimension of between about 1 and 2 nm, and a lateral dimension which extends approximately 50% of the lateral diameter $d_{avg}$ of each cavity 42. With the conductive pad 130 extending over least 50% of the floor of the cavity 82, the conductive pad 82 may to provide an optimum magnetic flux on activation of the transducer 20.

Following the deposition of the conductive pads 130 and leads 132, a selected upper preform half 100 is then aligned with and secured over the lower half 102 and fused thereto, as for example in accordance with one of the aforementioned previously described manner.

In a preferred construction, the individual plate leads 132 may extend as single traces to edge portions of each CMUT microarray module 16, allowing for the activation of the transducers 20 singularly, in selective groupings, or simultaneously, depending upon the intended sensor application.

Optionally, one or more further adhesion promoter and/or coating layers may be applied to the base and/or top wafers 80,84 prior to bonding. Suitable coating layers could include gold or other conductive metal coatings.

As a result, the embodiments of the sensor assembly 14 in accordance with foregoing embodiments feature one or more of the following:

1. The use or simulation of a 3D transducer configuration to shape and form the sonic beam;
2. An ultrasonic system using CMUT technology that uses or simulates a 3D placement of the CMUT transducers on a hyperbolic paraboloid surface to shape the beam;
3. The beam shape may be controlled by the design and shape of the hyperbolic paraboloid shape of the chip, and which in turn controls the overall width of the beam, with the flatter the surface the wider the beam;
4. A hyperbolic paraboloid shape which limits the size and effect of minor lobes, thus producing less interference;
5. With the CMUT transducers it is possible to achieve greater signal pressures in both sending and receiving function;
6. Each CMUT transducer may be operated individually, in selected groupings; and/or all at the same time thus providing extensive capability of beam steering and object location within the beam; and
7. The CMUT transducer design is smaller thus allows more transducers placed on every level thus more signal strength and resolution.
8. Simplified manufacture and/or enhanced reliability.

While the detailed description describes the transducers 20 in each microarray module 16 as being electrically connected in a vertical strip configuration, the invention is not so limited. Other manner of coupling transducers 20 will also be possible. While not limiting, it is envisioned that a next generation, groupings of electrically coupled transducers could be oriented in both vertical strips as well as horizontal strips to allow for frequency adjustment in two directions.

While a preferred use of the monitoring system 12 is provided in vehicle blind-spot monitoring, it is to be appreciated that its application is not limited thereto. Similarly, whilst the detailed description describes the capacitive micromachined ultrasonic transducer-based microarray modules 16 as being used in an automotive sensor 14, a variety of other applications will now be readily apparent. Such applications include without restriction, applications in the rail, marine and aircraft industries, as well as uses in association with various household applications, medical imaging, industrial and commercial environments and in consumer goods.

While the description describes various preferred embodiments of the invention, the invention is not restricted to the specific constructions and methods which are disclosed. Many modifications and variations will now occur to persons skilled in the art. For a definition of the invention, reference may be made to the appended claims.

I claim:

1. A method of forming a capacitive micromachined ultrasonic transducer (CMUT) for use in a microarray having a plurality of transducers, said method comprising,
   providing a first silicon-based wafer having a generally planar upper and lower surfaces,
   providing a second wafer as a device layer, said device layer having generally planar, parallel top and bottom surfaces, said device layer having thickness selected at between about 0.05 and 5 microns, and preferably between about 0.2 and 1 microns,
   forming a benzocyclobutene (BCB) layer over one of said upper surface or the bottom surface of said device layer,
   etching a surface of said BCB layer to form an etched surface having a plurality of pockets therein, each of said pockets having a preselected geometric shape, said pockets being characterized by respective sidewalls extending to a depth of between about 0.1 and 15 microns, preferably about 0.2 and 8 microns, and most preferably about 3 to 4 microns, and
   aligning a portion of the etched surface of the BCB layer and the other one of the upper surface or the bottom surface of the device layer,
   bonding said first wafer to said device layer with said BCB layer interposed therebetween, whereby said pockets form respective transducer air gaps,
   applying a conductive metal to at least one of the first wafer and the second wafer.

2. The method as claimed in claim 1, wherein said BCB layer comprises a BCB structural layer having a thickness greater than about 0.2 microns and said device layer comprises a silicon based device layer.

3. The method as claimed claim 2, wherein said step of forming comprises forming said BCB structural layer on said upper surface of said first wafer; and
maintaining said device layer as a substantially uncured BCB-based device layer prior to said step of bonding.

4. The method as claimed in claim 3, wherein prior to said step of etching, heating said BCB structural layer to partially cure said BCB to between about 30% to 70% of a fully cured state.

5. The method as claimed in claim 1, wherein said bonding step comprises heating the BCB structural layer to a fully cured state, and wherein BCB in said BCB structural layer adheres said first wafer to said device layer.

6. The method as claimed in claim 1, further comprising applying a conductive metal layer to at least part of said top surface of said device layer or the lower surface of said first wafer, said metal being selected from the group consisting of gold, silver and copper, wherein said conductive metal layer has a thickness selected at between about 1 and 500 nanometers, and preferably between about 5 and 50 nanometers,
said step of forming said pockets comprises forming said pockets in a generally square matrix, wherein groupings of said pickets are aligned in a plurality parallel rows and/or columns, and
wherein said step of applying said conductive metal layer comprises coating substantially the entirety of the top surface of the device wafer, and wherein after coating, selectively removing portions of said conductive metal layer to electrically isolate at least some of said groupings of said pockets from adjacent groupings.

7. The method as claimed in claim 6, wherein said step of applying, said conductive metal layer comprises, prior to bonding,
forming vias through said first wafer in an associated bottom region of respective ones of said pockets, and
forming conductive metal pads in said associated bottom regions, wherein said conductive pads provide electrical communication with said lower surface of said first wafer through said via.

8. The method of claim 6, further comprising electrically connecting groupings of said pockets to a switching assembly operable to selectively electrically couple said groupings to effect stronger signal output.

9. The method of claim 3, wherein said step of forming said BCB structural layer comprises applying BCB to the upper surface of the first wafer with a substantially thickness of between about 1 and 50 microns, and preferably between about 2 and 5 microns, and most preferably between 3 and 4 microns, and
said step of forming said pockets comprises forming a square array of at least one hundred pockets, and preferably at least five hundred pockets, each of said pockets having a generally flat bottom region.

10. A method of forming a capacitive micromachined transducer for use in a microarray comprising a plurality of transducers, said method comprising,
providing a silicon backing wafer having generally planar, parallel forward and rearward surfaces, said backing wafer having a thickness selected at between about 10 and 500 microns,
forming a benzocyclobutene (BCB) structural layer over said forward surface, said structural layer having a thickness selected at between about 0.5 to 15 microns, preferably between about 1 to 10 microns and most preferably 3 to 4 microns,
photo-plasma etching a surface of said BCB structural layer to form a plurality of pockets therein, said pockets having a generally common geometric shape and being characterized by a respective sidewall extending generally normal to said front surface and extending to a depth of between about 0.1 and 10 microns,
providing a device layer having generally planar, parallel opposing forward and rearward surfaces, said device layer having a thickness selected at between about 0.05 and 10 microns, preferably about 0.2 and 2 microns, and most preferably less than 1 micron,
positioning substantially contiguously bonding the rearward surface of the device wafer over the front surface to substantially seal each pocket as a respective transducers air gap, and wherein said device wafer is bonded relative to the first wafer with the BCB structural layer as a structural adhesive component,
applying a conductive metal layer to at least part of at least one of the first wafer and the device wafer.

11. The method as claimed in claim 10, wherein said device wafer comprises a silicon based device layer.

12. The method as claimed in claim 10, wherein said device wafer comprises a BCB based device layer,
wherein said step of forming comprises forming said BCB structural layer on said forward surface of said first wafer; and
maintaining said device layer as a generally uncured BCB-based device layer prior to said step of bonding.

13. The method us claimed in claim 10, wherein prior to said step of etching, heating said BCB structural layer to partially cure said BCB to between about 30% to 70% and preferably about 50% of a fully cured state.

14. The method as claimed in claim 13, wherein said bonding step comprises beating the BCB structural layer to a fully cured state, and wherein BCB in said BCB structural layer adheres said first wafer to said device wafer.

15. The method as claimed in claim 10, further comprising applying a the conductive metal coating to at least part of said forward surface of said device wafer or the rearward forward surface of said first wafer, said metal coating being selected from the group consisting of gold, silver, copper, and their alloys, and wherein said conductive metal layer has a thickness selected at between about 5 and 20 nanometers,
said geometric shape comprising a generally square shape having a lateral dimension selected at between about 5 and 200 microns, and
said step of forming said pockets comprises forming said pockets in a generally square matrix, wherein groupings of said pockets are aligned in a plurality parallel rows and/or columns,
wherein said step of forming said pockets comprises forming said pockets in a generally square matrix, wherein groupings of said pockets are aligned in a plurality of parallel rows and/or columns.

16. The method as claimed in claim 15, wherein said step of applying said conductive metal comprises coating substantially the entirety of the forward surface of the device wafer, and wherein after coating, selectively removing portions of said conductive metal coating to electrically isolate at least some of said groupings of said pockets from adjacent groupings.

17. The method as claimed in claim 16, wherein said step of applying said conductive metal coating comprises, prior to bonding, forming vias through said first wafer in associated bottom regions of respective ones of said pockets, and forming conductive pads in said associated bottom regions, wherein said conductive pads provide electrical communication with said lower surface of said first wafer through said via.

18. The method of claim 17, further comprising electrically connecting groupings of said pockets to a switching assembly operable to selectively electrically couple said groupings to a frequency generator.

19. An ultrasonic sensor system for transmitting and/or receiving a sensor beam, the system including a frequency generator and a sensor assembly comprising, a backing, a plurality of capacitive micromachined ultrasonic transducer (CMUT) microarray modules, the microarray modules being disposed in a grid matrix orientation on said backing, each said microarray including, a plurality of transducers having a transducer air gap and a diaphragm member, the microarray modules comprising:

a bottom silicon layer having a generally planar top and bottoms surfaces, a benzocyclobutene (BCB) structural layer having generally parallel planar forward and rearward surfaces, a plurality of pockets extending rearwardly into the forward surface of the BCB structural layer said pockets each respectively defining sides and a bottom or an associated transducer air gap and being oriented in an array and having a depth selected at between about 0.2 and 5 microns, preferably 3 to 4 microns and a width selected at between 5 and 200 microns and preferably 10 to 50 microns, and a device layer having front and rear surfaces, the device layer having a thickness selected at between about 0.1 and 25 microns, and preferably less than 1 micron, the BCB structural layer being interposed between a bottom of said device layer and said top surface of said bottom silicon layer with the device layer sealing each said pocket as an associated transducer diaphragm member, at least one first electrically conductive member electrically connected to one or more of said transducer diaphragm members, at least one second electrically conductive member interposed between said backing and the rear surface of said bottom silicon layer, the at least one first conductive member being electrically connectable to a ground or said frequency generator.

20. The sensor system as claimed in claim 19, wherein said device layer comprises a silicon-based layer having a thickness selected at between about 0.2 and 5 microns, and preferably less than 1 micron.

21. The sensor system as claimed in claim 19, wherein said device layer comprises a BCB layer having a thickness selected at between about 0.2 and 5 microns, and preferably less than 1 micron.

22. The sensor system as claimed in claim 19, wherein said BCB structural layer has a thickness selected at between about 1 micron and 40 microns, and preferably between about 3 microns and 4 microns, and wherein the BCB structural layer has a thickness between adjacent ones of said air gaps selected at at least one-half the depth of the pockets.

23. The sensor system as claimed in claim 19, further comprising an adhesion promoter coating interposed between part of said BCB structural layer and at least one of said bottom silicon layer and said device layer.

24. The sensor system as claimed in claim 19, comprising a plurality of said first electrically conductive members, said first electrically conductive members each electrically connecting an associated grouping of said transducer diaphragm members in each CMUT microarray, and further including, a switching assembly activatable to selectively connect said frequency generator to one or more of said first electrically conductive members to selectively activate associated groupings of transducers.

25. The sensor system as claimed in claim 24, wherein each said grouping comprises a columnar grouping of said transducers.

26. The sensor system as claimed in claim 19, wherein said array comprises a generally square-shaped array of at least 25 pockets, preferably at least 100 pockets, and more preferably at least 400 pockets.

27. The sensor system as claimed in claim 19, wherein the sensor assembly comprises a programmable vehicle park assist or blind-spot sensor, and wherein the transmitted sensor beam has a frequency selected at between 50 and 200 kHz, and preferably about 150 and 163 kHz.

* * * * *